United States Patent
Lee et al.

(10) Patent No.: US 11,201,169 B2
(45) Date of Patent: Dec. 14, 2021

(54) MEMORY DEVICE AND METHOD OF FABRICATING THE SAME

(71) Applicant: MACRONIX International Co., Ltd., Hsinchu (TW)

(72) Inventors: Chih-Hsiung Lee, Hsinchu (TW); Shaw-Hung Ku, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 16/835,360

(22) Filed: Mar. 31, 2020

(65) Prior Publication Data
US 2021/0305273 A1    Sep. 30, 2021

(51) Int. Cl.
*H01L 27/11582* (2017.01)
*H01L 27/11521* (2017.01)
*H01L 27/11556* (2017.01)
*H01L 21/28* (2006.01)
*H01L 27/11568* (2017.01)
(Continued)

(52) U.S. Cl.
CPC .... *H01L 27/11582* (2013.01); *H01L 21/0214* (2013.01); *H01L 21/0217* (2013.01); *H01L 21/02164* (2013.01); *H01L 21/02167* (2013.01); *H01L 21/31111* (2013.01); *H01L 21/32134* (2013.01); *H01L 27/11521* (2013.01); *H01L 27/11556* (2013.01); *H01L 27/11568* (2013.01); *H01L 29/40114* (2019.08); *H01L 29/40117* (2019.08)

(58) Field of Classification Search
CPC ......... H01L 29/40117; H01L 21/31144; H01L 21/76224; H01L 23/5226; H01L 27/11565
See application file for complete search history.

(56) References Cited

U.S. PATENT DOCUMENTS 9,236,394 B2   1/2016   Rhie
9,589,982 B1   3/2017   Cheng et al.
(Continued)

FOREIGN PATENT DOCUMENTS

TW   201535390   9/2015
TW   201711138   3/2017
(Continued)

OTHER PUBLICATIONS

"Office Action of Taiwan Counterpart Application", dated Dec. 4, 2020, pp. 1-8.

*Primary Examiner* — Zandra V Smith
*Assistant Examiner* — Andre C Stevenson
(74) *Attorney, Agent, or Firm* — J.C. Patents

(57) ABSTRACT

A memory device includes: a first bit line located on a dielectric layer and a second bit line located over the dielectric layer; a first word line and a second word line located between the first bit line and the second bit line; a source line located between the first word line and the second word line; a channel pillar penetrating through the first word line and the source line and the second word line, and being connected to the first bit line, the source line and the second bit line; and a charge storage structure including an upper portion surrounding an upper sidewall of the channel pillar and located between the second word line and the channel pillar; and a lower portion surrounding a lower sidewall of the channel pillar and located between the first word line and the channel pillar.

16 Claims, 19 Drawing Sheets

(51) Int. Cl.
  *H01L 21/02*      (2006.01)
  *H01L 21/311*     (2006.01)
  *H01L 21/3213*    (2006.01)

(56) References Cited

U.S. PATENT DOCUMENTS

| | | | |
|---|---|---|---|
| RE47,816 E | 1/2020 | Rhie | |
| 10,777,566 B2 | 9/2020 | Lue | |
| 2015/0131381 A1 | 5/2015 | Rhie | |
| 2016/0049423 A1* | 2/2016 | Yoo | H01L 27/11565 |
| | | | 257/324 |
| 2016/0071869 A1* | 3/2016 | Lee | H01L 21/31116 |
| | | | 257/314 |
| 2017/0077118 A1 | 3/2017 | Cheng et al. | |
| 2018/0342531 A1 | 11/2018 | Susuki et al. | |
| 2019/0096898 A1* | 3/2019 | Liu | H01L 27/11582 |
| 2019/0148393 A1 | 5/2019 | Lue | |
| 2020/0266182 A1* | 8/2020 | Nishikawa | H01L 24/48 |

FOREIGN PATENT DOCUMENTS

| | | |
|---|---|---|
| TW | 201931577 | 8/2019 |
| TW | 202002254 | 1/2020 |

\* cited by examiner

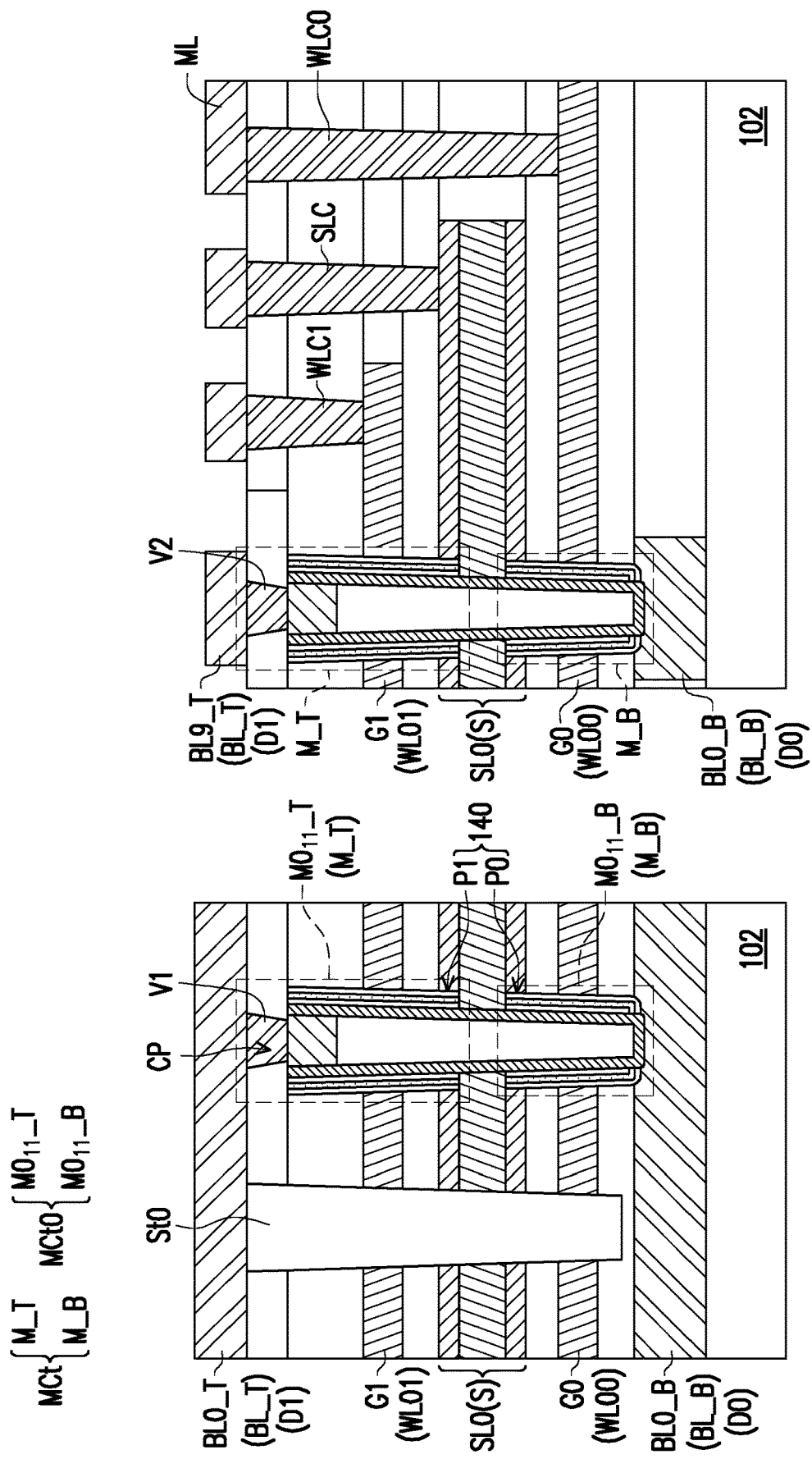

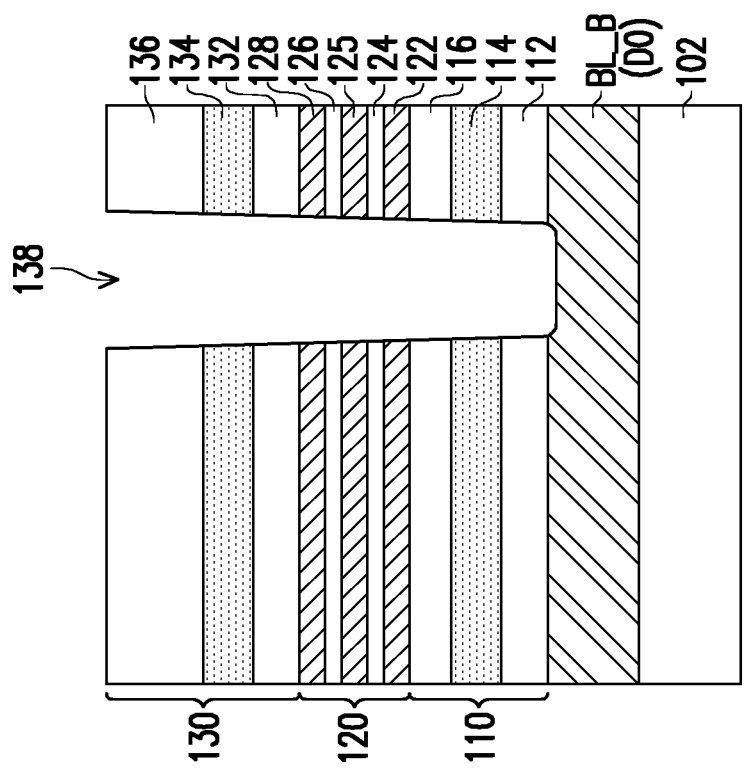
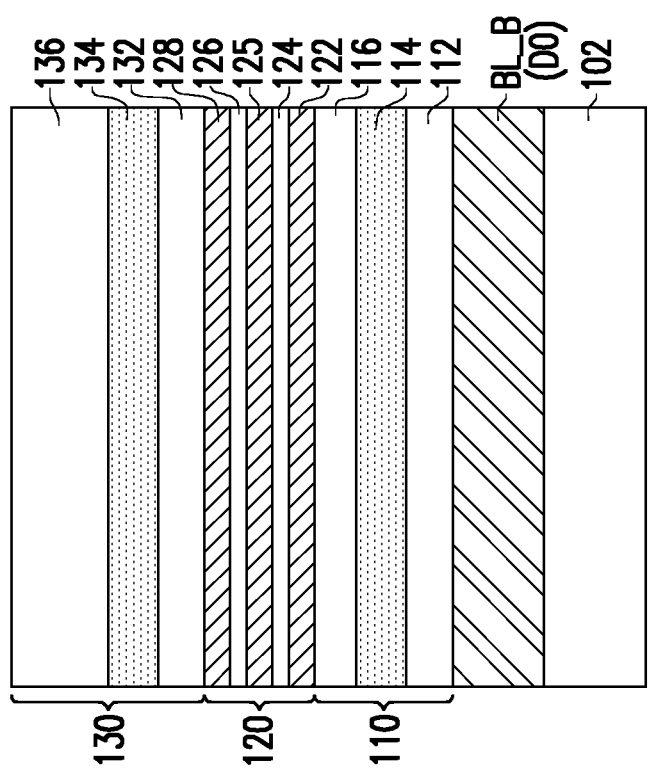
FIG. 3B
FIG. 3A

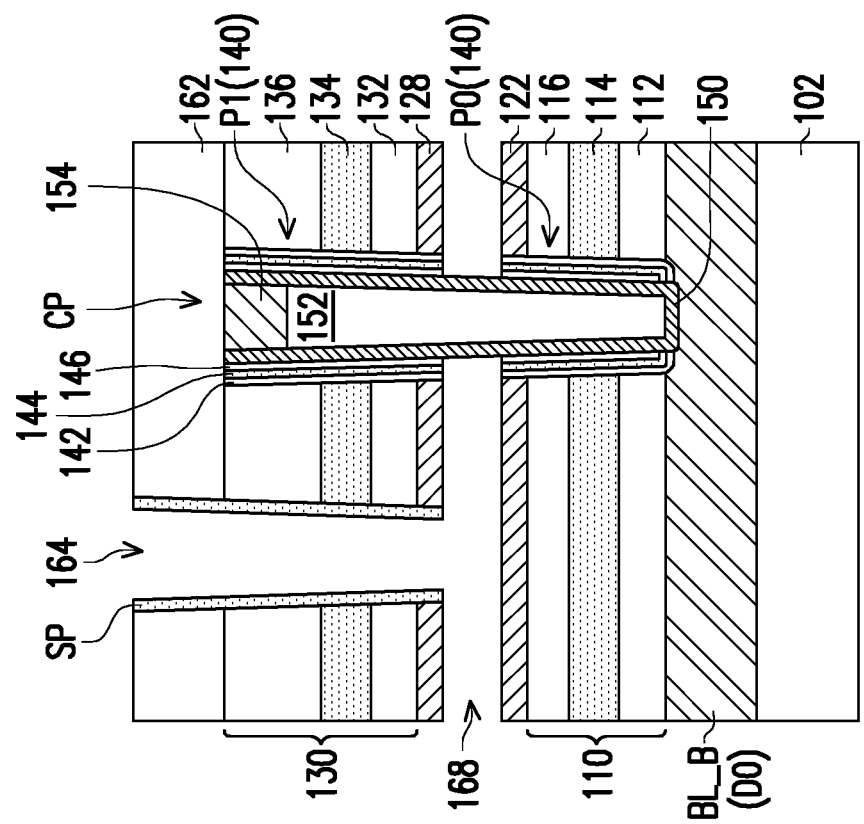
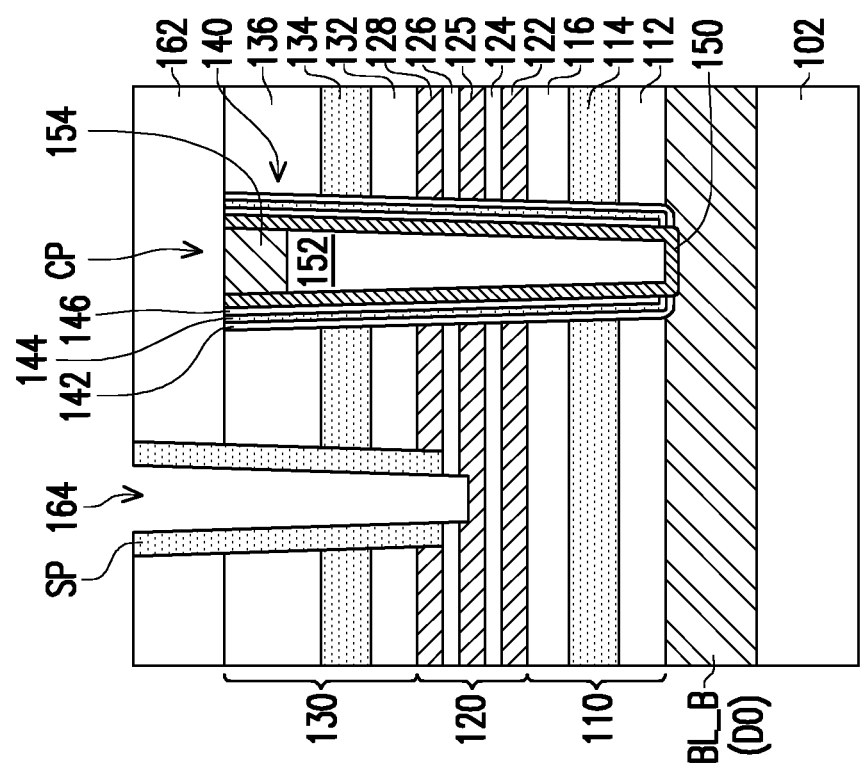
FIG. 3I
FIG. 3J

MEMORY DEVICE AND METHOD OF FABRICATING THE SAME

BACKGROUND

Technical Field

The invention relates to a memory device and a method of fabricating the same.

Description of Related Art

Along with rapid development of science and technology, advances of electronic devices have increased the need for greater storage capacity. In order to meet the need of high storage density, sizes of memory devices become smaller and integration degrees thereof become higher. Therefore, patterns of the memory devices have evolved from two-dimensional (2D) memory devices with planar gate structures to three-dimensional (3D) memory devices with vertical channel (VC) structures. However, the 3D memory devices with the vertical channel structures still have many challenges.

SUMMARY

The invention is directed to a memory device and a method of fabricating the same, where the memory device has a plurality of memory cells stacked vertically in a unit area to effectively utilize an area of a substrate, and the method is compatible with existing processes.

An embodiment of the invention provides a memory device including at least one semiconductor layer located on a dielectric layer. The at least one semiconductor layer includes a first bit line and a second bit line, wherein the first bit line is located on the dielectric layer, and the second bit line is located on the first bit line; a first word line and a second word line, located between the first bit line and the second bit line; a source line, located between the first word line and the second word line; a channel pillar, penetrating through the first word line, the source line, and the second word line, and is connected to the first bit line, the source line, and the second bit line; and a charge storage structure, including an upper portion surrounding an upper sidewall of the channel pillar and located between the second word line and the channel pillar; and a lower portion surrounding a lower sidewall of the channel pillar and located between the first word line and the channel pillar. The first word line, the lower portion of the charge storage structure, the channel pillar, the first bit line, and the source line form a first memory cell. The second word line, the upper portion of the charge storage structure, the channel pillar, the second bit line, and the source line form a second memory cell, and the second memory cell is located above the first memory cell.

An embodiment of the invention provides a method of fabricating a memory device including following steps. A first bit line is formed on a dielectric layer. At least one cycle process as follows is performed. A first stacked structure, a second stacked structure and a third stacked structure are formed on the first bit line and the dielectric layer, wherein the first stacked structure and the third stacked structure respectively include a first insulating layer, a sacrificial layer and a second insulating layer stacked from bottom to top. A hole is formed in the third stacked structure, the second stacked structure and the first stacked structure. A charge storage structure is formed on a sidewall of the hole. A channel pillar is formed in the hole, wherein the channel pillar covers the charge storage structure and is connected to the first bit line. A recess slit is formed in the third stacked structure and a part of the second stacked structure. A passivation layer is formed on a sidewall of the recess slit. The third stacked structure and the passivation layer are taken as a mask to remove a part of the second stacked structure and a part of the charge storage structure to form a source line trench, expose a sidewall of the channel pillar, and separate the charge storage structure into an upper portion and a lower portion. A source line is formed in the source line trench. A part of the source line and a part of the first stacked structure below the recess slit are moved to deepen the recess slit. The passivation layer is removed. The sacrificial layer of the first stacked structure and the sacrificial layer of the third stacked structure exposed by the recess slit, and the of are removed to form a first word line trench and a second word line trench. A first word line and a second word line are formed in the first word line trench and the second word line trench. An insulating silt is formed in the recess slit. A second bit line is formed over the third stacked structure, and the second bit line is electrically connected to the channel pillar. The first word line, the lower portion of the charge storage structure, the channel pillar, the first bit line, and the source line form a first memory cell. The second word line, the upper portion of the charge storage structure, the channel pillar, the second bit line, and the source line form a second memory cell.

The 3D memory device of the invention includes a plurality of memory cells stacked vertically in a unit area, so as to effectively utilize the area of the substrate. In addition, the fabrication process of the 3D memory device of the invention may be compatible with the existing fabrication process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B is a cross-sectional view of FIG. 1A along a line B-B'.

FIG. 1C is a cross-sectional view of FIG. 1A along a line C-C'.

DESCRIPTION OF THE EMBODIMENTS

Figure 1A:
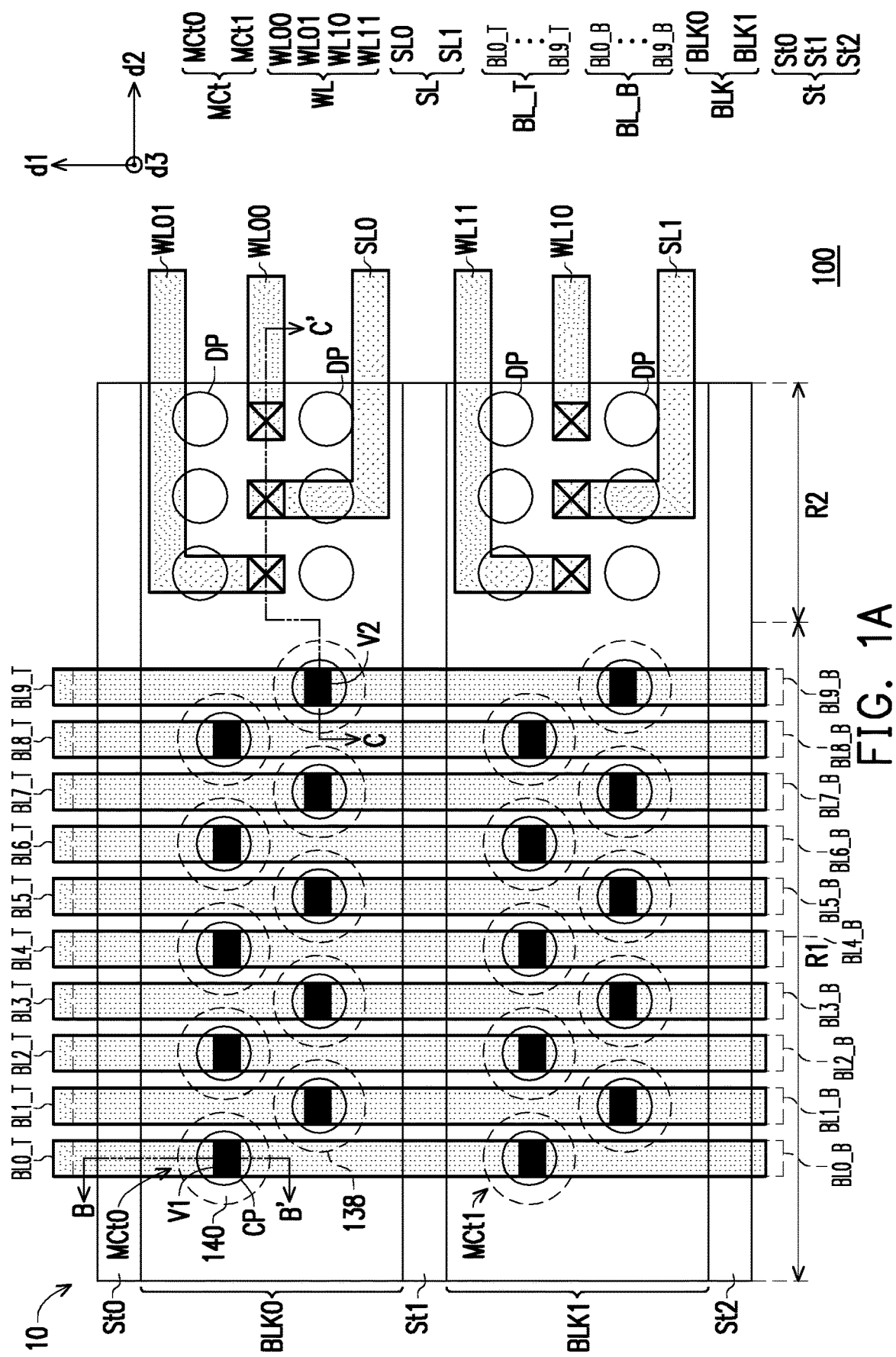
FIG. 1A is a top view of a memory device according to an embodiment of the invention.

Referring to FIG. 1A, a memory device 10 of an embodiment of the invention is a three-dimensional (3D) NOR flash memory device, which is disposed on a substrate 100. The substrate 100 includes a plurality of blocks BLK separated by a plurality of insulating silts St. In FIG. 1A, the blocks BLK are represented by two blocks BLK0 and BLK1, but the invention is not limited thereto. The block BLK0 and the block BLK1 are separated by insulating silts (or referred to as insulating slits) St0, St1 and St2. The memory device 10 includes a plurality of memory cell groups MCt located in a first region R1 of each of the blocks BLK. The first region R1 may also be referred to as a memory cell region. The memory cell groups MCt in each of the blocks BLK may be respectively arranged in an array formed by a plurality of columns and a plurality of rows. The memory cell groups MCt of two adjacent rows may be aligned or staggered. For example, the memory cell groups MCt0 in the block BLK0 are arranged in an array formed by a plurality of columns and a plurality of rows, and the memory cell groups MCt0 of two adjacent rows may be staggered with each other (as that shown in FIG. 1A) or aligned with each other (not shown). The memory cell groups MCt1 in the block BLK1 are also arranged in an array formed by a plurality of columns and a plurality of rows, and the memory cell groups MCt1 of two adjacent rows may be staggered with each other (as that shown in FIG. 1A) or aligned with each other (not shown). Moreover, the memory cell groups MCt0 of the odd-numbered rows in the block BLK0 and the memory cell groups MCt1 of the odd-numbered rows in the block BLK1 are aligned with each other in a first direction d1. The memory cell groups MCt0 of the even-numbered rows in the block BLK0 and the memory cell groups MCt1 of the even-numbered rows in the block BLK1 are aligned with each other in the first direction d1.

Referring to FIG. 1B, each of the memory cell groups MCt includes first memory cell M_B and second memory cell M_T stacked in a third direction d3. For example, in FIG. 2, the block BLK0 has first memory cells $M0_{11}\_B$, $M0_{12}\_B$ and $M0_{13}\_B$ and second memory cells $M0_{11}\_T$, $M0_{12}\_T$ and $M0_{13}\_T$. The second memory cells $M0_{11}\_T$, $M0_{12}\_T$ and $M0_{13}\_T$ are respectively disposed on top of the first memory cells $M0_{11}\_B$, $M0_{12}\_B$ and $M0_{13}\_B$, and respectively form one memory cell group MCt0. Similarly, the block BLK1 has first memory cells $M1_{11}\_B$, $M1_{12}\_B$ and $M1_{13}\_B$ and second memory cells $M1_{11}\_T$, $M1_{12}\_T$ and $M1_{13}\_T$. The second memory cells $M1_{11}\_T$, $M1_{12}\_T$ and $M1_{13}\_T$ are respectively disposed on top of the first memory cells $M1_{11}\_B$, $M1_{12}\_B$ and $M1_{13}\_B$, and respectively form one memory cell group MCt1.

Figure 2:
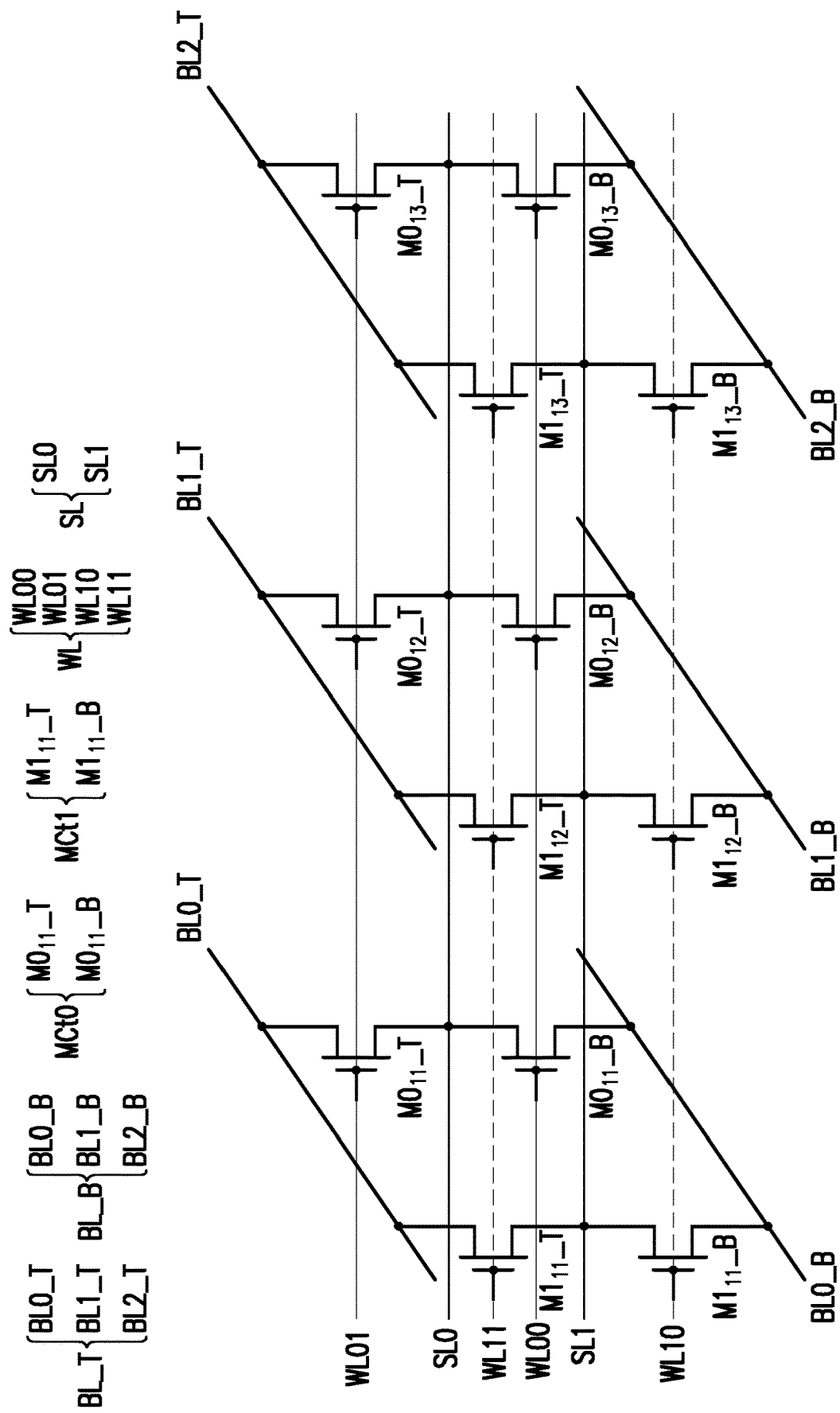
FIG. 2 is a partial equivalent circuit diagram of FIG. 1A.

Referring to FIG. 1A and FIG. 2, the memory device 10 further includes a bit line BL_B and a bit line BL_T extending in the first direction d1. The bit line BL_T is correspondingly disposed above the bit line BL_B. The bit line BL_B, for example, includes bit lines BL0_B, BL1_B, . . . BL9_B, or more. The bit line BL_T, for example, includes bit lines BL0_T, BL1_T, . . . BL9_T, or more. Each bit line BL_B and each bit line BL_T may connect drains of the first memory cells and drains of the second memory cells in different blocks BLK in series. For example, a bit line BL0_B may connect the drain of the first memory cell $M0_{11}\_B$ in the block BLK0 and the drain of first memory cell $M1_{11}\_B$ in the block BLK1 in series. A bit line BL0_T may connect the drain of the second memory cell $M0_{11}\_T$ in the block BLK0 and the drain of second memory cell $M1_{11}\_T$ in the block BLK1 in series.

Referring to FIG. 1A and FIG. 2, the memory device 10 further includes a plurality of source lines SL to connect common sources of a plurality of the first memory cells and a plurality of the second memory cells of a same row in a same block BLK. For example, the memory device_10 further includes source lines SL0 and SL1. The source line SL0 may connect a common source of the first memory cell $M0_{11}\_B$ and the second memory cell $M0_{11}\_T$, a common source of the first memory cell $M0_{12}\_B$ and the second memory cell $M0_{12}\_T$, and a common source of the first memory cell $M0_{13}\_B$ and the second memory cell $M0_{13}\_T$ in the block BLK0 in series. Similarly, a source line SL1 may connect a common source of the first memory cell $M1_{11}\_B$ and the second memory cell $M1_{11}\_T$, a common source of the first memory cell $M1_{12}\_B$ and the second memory cell $M1_{12}\_T$, and a common source of the first memory cell $M1_{13}\_B$ and the second memory cell $M1_{13}\_T$ in the block BLK1 in series.

Referring to FIG. 1A and FIG. 2, the memory device 10 further includes a plurality of word lines WL to connect gates of a plurality of the first memory cells of a same row or gates of a plurality of the second memory cells of a same row in a same block BLK. For example, a word line WL00 connects the gates of the first memory cells $M0_{11}\_B$, $M0_{12}\_B$ and $M0_{13}\_B$ of a same row (the first row) in the block BLK0. A word line WL01 connects the gates of the second memory cells $M0_{11}\_T$, $M0_{12}\_T$ and $M0_{13}\_T$ of a same row (the second row) in the block BLK0. A word line WL10 connects the gates of the first memory cells $M1_{11}\_B$, $M1_{12}\_B$ and $M1_{13}\_B$ of a same row (the first row) in the block BLK1. A word line WL11 connects the gates of the second memory cells $M1_{11}\_T$, $M1_{12}\_T$ and $M1_{13}\_T$ of a same row (the second row) in the block BLK1.

Referring to FIG. 1B, in the embodiment, the memory cell group MCt0 in the block BLK0 includes the first memory cell $M0_{11}\_B$ and the second memory cell $M0_{11}\_T$. The first memory cell $M0_{11}\_B$ includes a gate G0 (i.e., the word line WL00), a lower portion P0 of a charge storage structure 140, a channel pillar CP, the bit line BL0_B (a drain D0), and the source line SL0 (a source S, or referred to as a common source). The second memory cell $M0_{11}\_T$ is disposed above the first memory cell $M0_{11}\_B$. The second memory cell $M0_{11}\_T$ includes a gate G1 (i.e., the word line WL01), an upper portion P1 of the charge storage structure 140, the channel pillar CP, the bit line BL0_T (a drain D1), and the source line SL0 (the source S, or referred to as the common source). The gate G0 and the gate G1 are disposed between the bit line BL0_B (the drain D0) and the bit line BL0_T (the drain DD. The gate G0 and the gate G1 are respectively located around and in physical contact with the lower portion P0 and the upper portion P1 of the charge storage structure 140. The lower portion P0 and the upper portion P1 of the charge storage structure 140 are separated from each other, and a portion of external sidewall of the channel pillar CP is exposed. The source line SL0 (the source S) is disposed between the gate G0 and the gate G1. The source line SL0 (the source S) is in physical contact with the portion of external sidewall of the channel pillar CP. The bit line BL0_B (the drain D0 is in physical contact with a bottom surface of the channel pillar CP. The bit line BL0_T (the drain D0 is electrically connected to the channel pillar CP through a via V1.

Referring to FIG. 1A and FIG. 1C, an end of the word line WL00 is connected to a metal layer ML through a word line contact WLC0. An end of the word line WL01 is connected to the metal layer ML through a word line contact WLC1. An end of the source line SL0 is connected to the metal layer ML through a source line contact SLC. The end of the word line WL00, the end of the source line SL0, and the end of the word line WL01 are disposed in a second region R2 of the block BLK0. The end of the word line WL00, the end of the source line SL0, and the end of the word line WL01 may present a stepped shape, and the second region R2 may also be referred to as a stepped region.

Referring to FIG. 1A and FIG. 1B, in some embodiments, the second region R2 may further include a plurality of dummy pillars DP. The dummy pillars DP are used to provide support to the structure during a fabrication process to avoid collapse of layers or the structure. The dummy pillars DP may be formed at a same time when memory holes (or referred to as channel holes), the charge storage structure 140, and the channel pillar CP are formed. A structure of the dummy pillar DP may be the same as a combined structure of the charge storage structure 140 and the channel pillar CP, but a size thereof may be the same as or similar to that of the memory hole (or the channel hole). Regarding the channel pillar CP and the dummy pillars DP disposed in the block BLK0, the bit line BL0_B is located under the channel pillar CP, and the channel pillar CP is electrically connected to the bit line BL0_B, while the bit line BL0_B is not located under the dummy pillar DP, and the dummy pillar DP is not electrically connected to the bit line BL0_B. A via, for example, the via V1 is formed above the channel pillar CP to electrically connect the bit line BL0_T, while no via is formed above the dummy pillar DP, and the dummy pillar DP and the bit line BL0_T are not electrically connected. The gate G0, the source line SL0 or the gate G1 are located around and in contact with a sidewall of the dummy pillar DP.

Referring to FIG. 3A, a fabrication method of the memory device 10 (shown in FIG. 1A) of the embodiment of the invention is as follows. First, a substrate (not shown) is provided. The substrate includes a semiconductor substrate, for example, a silicon substrate. Then, a dielectric layer 102 is formed on the substrate. A material of the dielectric layer 102 is, for example, silicon oxide formed through chemical vapor deposition. A plurality of the bit lines BL_B are formed on the dielectric layer 102. The bit lines BL_B may also be referred to as drains (D0). A method of forming the bit lines BL_B is, for example, to use chemical vapor deposition to form doped polysilicon, and then perform patterning by using a lithography and etching process.

Then, a first stacked structure 110, a second stacked structure 120 and a third stacked structure 130 are formed on the bit lines BL_B and the dielectric layer 102. The first stacked structure 110 includes a first insulating layer 112, a sacrificial layer 114 and a second insulating layer 116 stacked from bottom to top. A material of the first insulating layer 112 and the second insulating layer 116 is, for example, silicon oxide formed through chemical vapor deposition. A material of the sacrificial layer 114 is different from the material of the first insulating layer 112 and the second insulating layer 116, and is, for example, silicon nitride formed through chemical vapor deposition. Thicknesses of the first insulating layer 112, the sacrificial layer 114 and the second insulating layer 116 may be the same or different.

The second stacked structure 120 includes a first doped polysilicon layer 122, a first sacrificial layer 124, a second sacrificial layer 125, a third sacrificial layer 126 and a second doped polysilicon layer 128 stacked from bottom to top. A material of the first sacrificial layer 124 and the third sacrificial layer 126 is different to a material of the first doped polysilicon layer 122 and the second doped polysilicon layer 128, which is, for example, silicon oxide formed through chemical vapor deposition. A material of the second sacrificial layer 125 is different to the material of the first sacrificial layer 124 and the third sacrificial layer 126, which is, for example, a doped polysilicon layer formed through chemical vapor deposition. Thicknesses of the first doped polysilicon layer 122, the first sacrificial layer 124, the second sacrificial layer 125, the third sacrificial layer 126 and the second doped polysilicon layer 128 may be the same or different.

The third stacked structure 130 includes a first insulating layer 132, a sacrificial layer 134 and a second insulating layer 136 stacked from bottom to top. A material of the first insulating layer 132 and the second insulating layer 136 is, for example, silicon oxide formed through chemical vapor deposition. A material of the sacrificial layer 134 is different from the material of the first insulating layer 132 and the second insulating layer 136, and is, for example, silicon nitride formed through chemical vapor deposition. Thicknesses of the first insulating layer 132, the sacrificial layer 134 and the second insulating layer 136 may be the same or different. For example, the thickness of the second insulating layer 136 may be greater than the thickness of the first insulating layer 132 and the sacrificial layer 134.

Referring to FIG. 3B, a patterning process is performed through a lithography and etching process to form a plurality of holes 138 in the third stacked structure 130, the second stacked structure 120 and the first stacked structure 110. The holes 138 may also be referred to as memory holes or channel holes. Each of the holes 138 exposes the bit line BL_B. From the plane view shown in FIG. 1A, a shape of the hole 138 may be a circle, an oval, etc. In some embodiments, a plurality of holes (not shown) are also formed the third stacked structure 130, the second stacked structure 120 and the first stacked structure 110 in the stepped region (not shown) of the substrate, and no bit line BL_B is located below the holes. These holes are used to form the dummy pillars (as shown in FIG. 1A) to support the structure of the semiconductor device in subsequent processes to avoid collapse of layers or the structure.

Figure 3C:
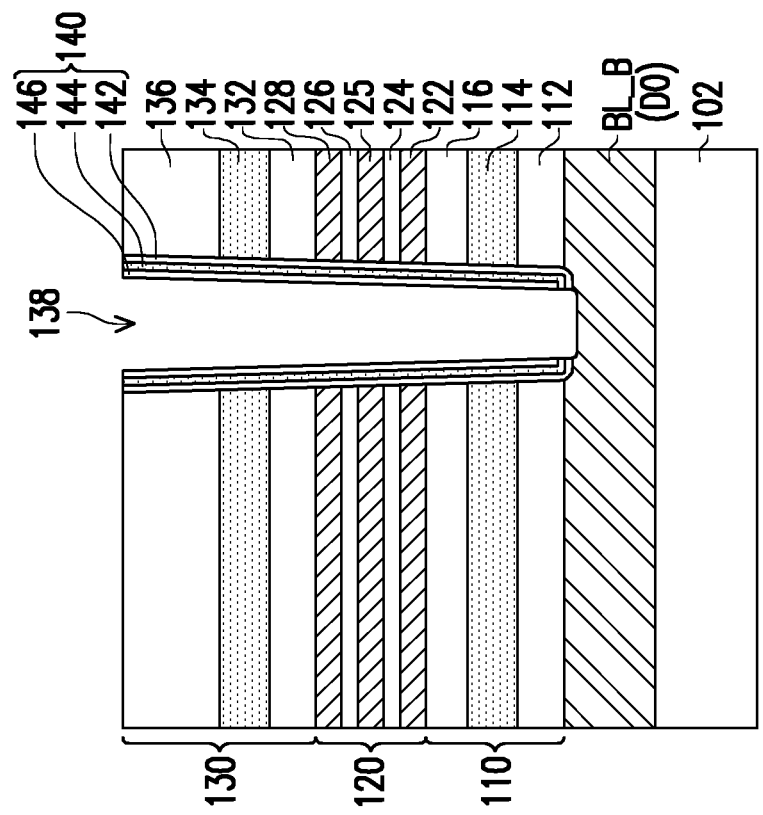
FIG. 3A to FIG. 3O are schematic cross-sectional views of a fabrication process of a memory device according to an embodiment of the invention.

Referring to FIG. 3C, a charge storage structure 140A is formed on a top surface of the third stacked structure 130 and a sidewall and a bottom surface of each of the holes 138. In an embodiment, the charge storage structure 140A may include a blocking layer 142, a charge storage layer 144 and a tunneling layer 146. The blocking layer 142/the charge storage layer 144/the tunneling layer 146 is, for example, a composite layer of oxide/nitride/oxide (ONO), or a composite layer formed by other materials. The charge storage structure 140A may also be, for example, a composite layer of oxide/nitride/oxide/nitride/oxide (ONONO), a composite layer of silicon/oxide/nitride/oxide/silicon (SONOS), aluminium oxide/oxide/nitride/oxide ($Al_2O_3$/O/N/O) or other suitable composite layers. The charge storage structure 140A may be formed by processes such as chemical vapor deposition, thermal oxidation, nitridation, etching, etc.

Figure 3D:
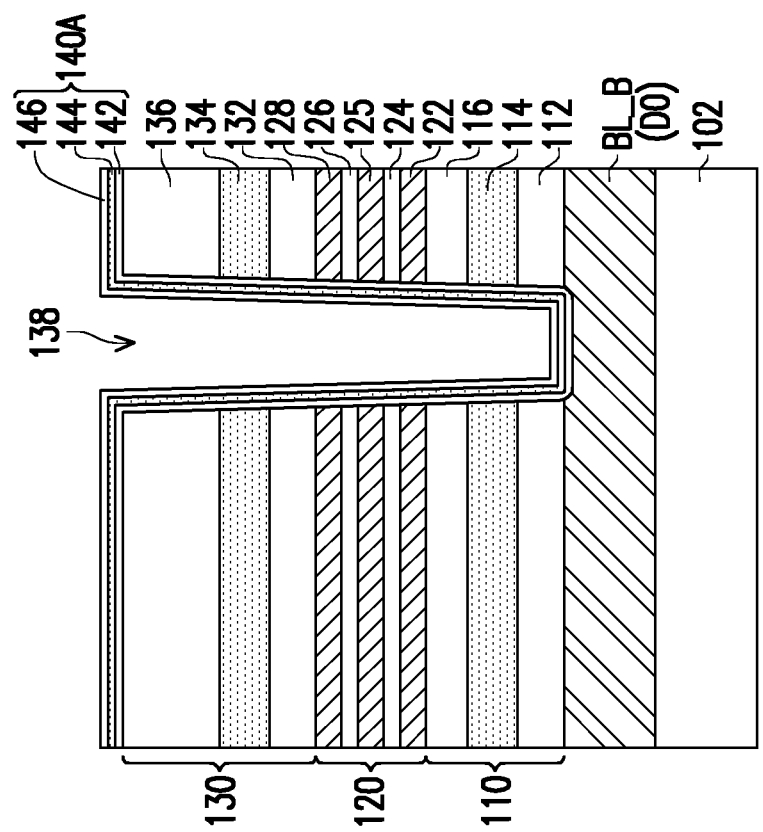

Referring to FIG. 3D, an anisotropic etching process is performed to remove the charge storage structure 140 on the top surface of the third stacked structure 130 and the bottom surface of the hole 138. The charge storage structure 140 on the sidewall of the hole 138 is left, and the bit line BL_B on the bottom surface of the hole 138 is exposed. In some embodiments, the charge storage structure 140 is also formed on sidewalls of a plurality of the holes (not shown) in the stepped region of the substrate.

Figure 3F:
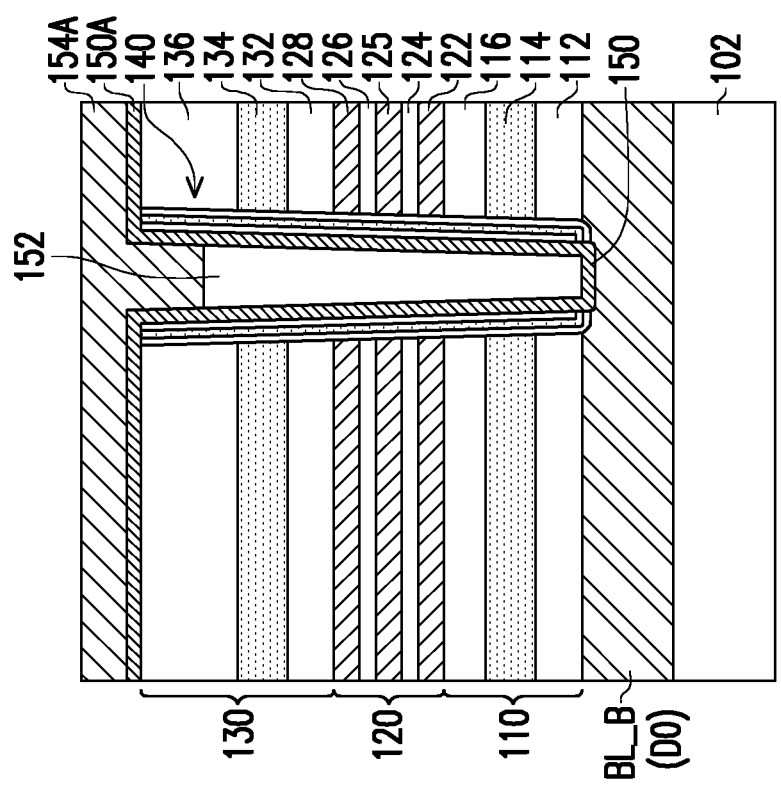
Figure 3E:
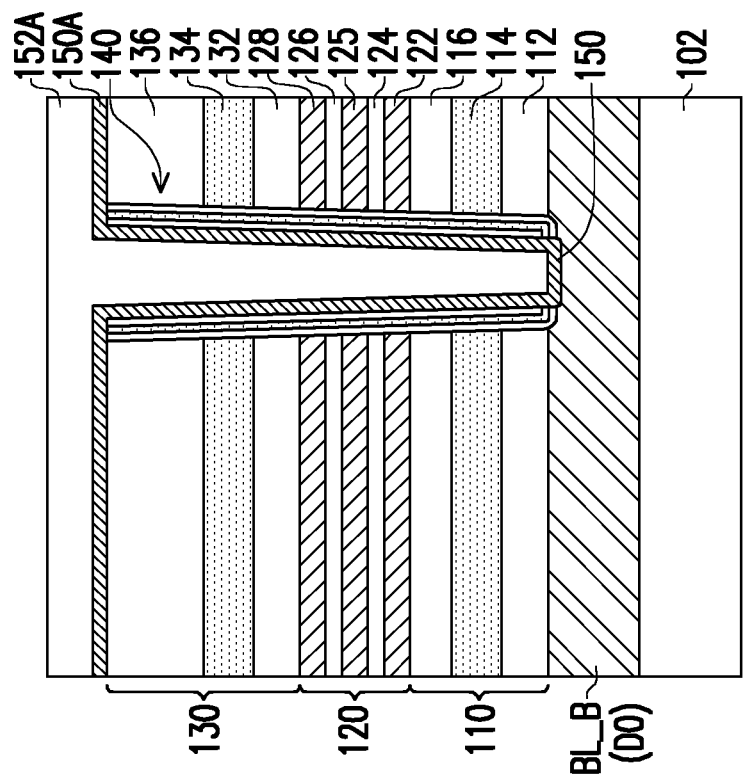

Referring to FIGS. 3E to 3F, a process of forming a channel pillar CP in the hole 138 is performed. In some embodiments, a method for forming the channel pillar CP includes following steps. First, a channel layer 150A and an insulating material 152A are formed on the third stacked structure 130 and in the hole 138, as shown in FIG. 3E. The channel layer 150A conformally covers the third stacked structure 130, a sidewall of the charge storage structure 140, and a top surface of the bit line BL_B, and is electrically connected to the bit line BL_B. The channel layer 150A includes a doped semiconductor material, an undoped semiconductor material, or a combination thereof. For example, the channel layer 150A may be formed by first performing a chemical vapor deposition process or a physical vapor deposition process to form an undoped polysilicon layer, and then performing an annealing process to complete fabricating the channel layer 150A. The insulating material 152A covers the channel layer 150A and fills the hole 138. The insulating material 152A is, for example, silicon oxide, silicon nitride, silicon oxynitride, other suitable dielectric materials or a combination thereof formed through chemical vapor deposition.

Referring to FIG. 3F, a part of the insulating material 152A is removed to form an insulating core 152 in the hole 138. The removal process may be a single-stage etching process, a two-stage etching process, a multi-stage etching process, a chemical mechanical polishing process, or a combination thereof. The etching process may be, for example, anisotropic etching, isotropic etching, or a combination thereof. A top surface of the insulating core 152 is lower than the top surface of the third stacked structure 130, and therefore, a groove (not shown) is formed on the top surface of the insulating core 152. Then, a conductive layer 154A is formed on the top surface of the third stacked structure 130 and in the groove above the insulating core 152. The conductive layer 154A is, for example, doped polysilicon, tungsten, platinum, or a combination thereof formed through a chemical vapor deposition process or a physical vapor deposition process.

Figure 3H:
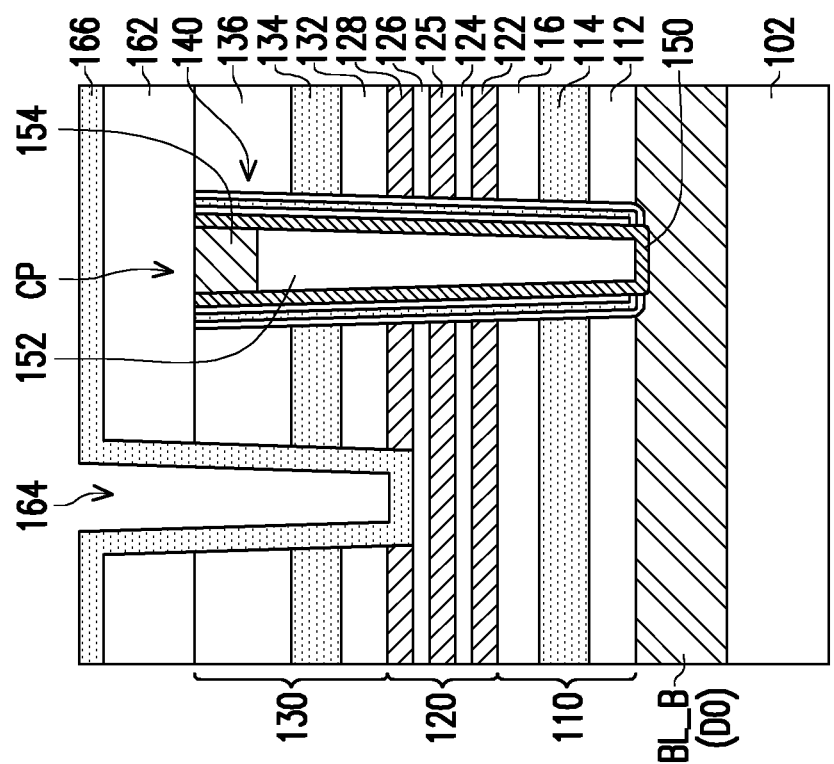
Figure 3G:
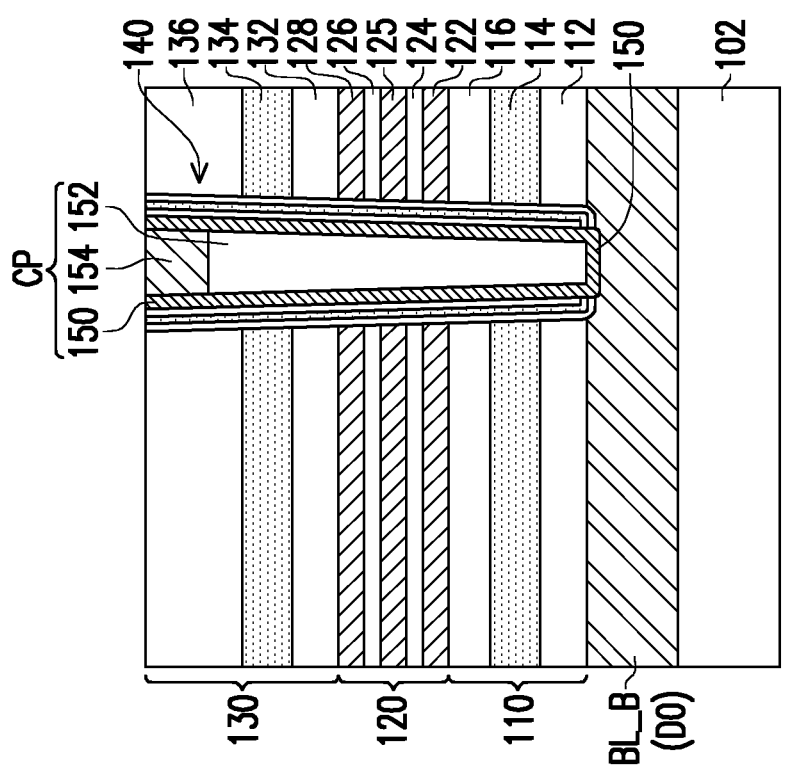

Referring to FIG. 3G, an etch-back process or a chemical mechanical polishing process is performed to remove the conductive layer 154A on the top surface of the third stacked structure 130 to form a conductive plug 154 in the groove, so that fabrication of the channel pillar CP is completed. The channel pillar CP includes the insulating core 152, the conductive plug 154 and the channel layer 150. The insulating core 152 is located in the hole 138. The conductive plug 154 is located on the insulating core 152, and is electrically connected to the channel layer 150. The channel layer 150 is a conformal layer that surrounds sidewalls of the insulating core 152 and the conductive plug 154, and wraps the bottom of the insulating core 152, and is electrically connected to the conductive plug 154 and the bit line BL_B. In some embodiments, structures similar to the insulating core 152, the conductive plug 154, and the channel layer 150 are also formed in a plurality of holes (not shown) in the stepped region of the substrate to form the dummy pillars. No bit line BL_B is disposed under the dummy pillars, and the dummy pillars are not electrically connected to the bit line BL_B.

Referring to FIG. 3H, a stop layer 162 is formed on the third stacked structure 130. A material of the stop layer 162 includes silicon oxide, silicon nitride, silicon oxynitride, silicon carbide, or a combination thereof formed by chemical vapor deposition (CVD). In some embodiments, the stop layer 162 includes a material different from the material of the topmost second insulating layer 136.

Then, a recess slit 164 is formed in the stop layer 162, the third stacked structure 130, and a part of the second stacked structure 120. In some examples, the recess slit 164 at least extends through the second doped polysilicon layer 128 in depth to expose the third sacrificial layer 126 at the bottom.

Thereafter, a passivation layer 166 is formed over the third stacked structure 130 and in the recess slit 164 to cover a sidewall and a bottom surface of the recess slit 164. The passivation layer 166 may be a single layer or multiple layers. A material of the passivation layer 166 includes nitride, oxide, silicon oxynitride (SiON), silicon carbide (SiC), silicon carbon nitride (SiCN), silicon carbide oxynitride (SiCON), a composite layer thereof, or a composite layer of other materials.

Referring to FIG. 3I, an anisotropic etching process is performed to remove the passivation layer 166 on the stop layer 162 and on the bottom surface of the recess slit 164 to form a passivation layer SP. During the etching process, a part of the third sacrificial layer 126 and the second sacrificial layer 125 is also etched, so that a depth of the recess slit 164 is deepened to expose the second sacrificial layer 125. The passivation layer SP covers the stop layer 162, the second insulating layer 136, the sacrificial layer 134, the first insulating layer 132, and the polysilicon layer 128 on the sidewall of the recess slit 164.

Referring to FIG. 3J, the stop layer 162 and the passivation layer SP are taken as a mask to perform an etching process, and an etchant flows into the recess slit 164 to remove the third sacrificial layer 126 and a part of the blocking layer 142, the second sacrificial layer 125 and a part of the charge storage layer 144, and the first sacrificial layer 124 and a part of the tunneling layer 146 to form a source line trench 168 and divide the charge storage structure 140 into two portions, such as the lower portion P0 and the upper portion P1. The etching process may be a single-stage etching process, a two-stage etching process, or a multi-stage etching process. The etching process may be, for example, anisotropic etching, isotropic etching, or a combination thereof. During this stage of the process, a part of the blocking layer 142, a part of the charge storage layer 144, and a part of the tunneling layer 146 of the dummy pillars are also removed, but the insulating core 152, the conductive plug 154, and the channel layer 150 of the dummy pillars may be left in the stepped region of the substrate to provide structural support during the fabrication process to avoid collapse of the layers or the structure.

In an embodiment, the third sacrificial layer 126 and the blocking layer 142, and the first sacrificial layer 124 and the tunneling layer 146 are all silicon oxide. The second sacrificial layer 125 and the charge storage layer 144 are respectively polysilicon and silicon nitride. The passivation layer SP may be a silicon nitride layer with a thickness greater than that of the charge storage layer 144 or a composite layer of silicon nitride/silicon oxide/silicon nitride. The removal process may include following steps. In FIGS. 4A to 4D, the passivation layer SP is represented by a composite layer of silicon nitride 66B/silicon oxide 66M/silicon nitride 66T.

Figure 4B:
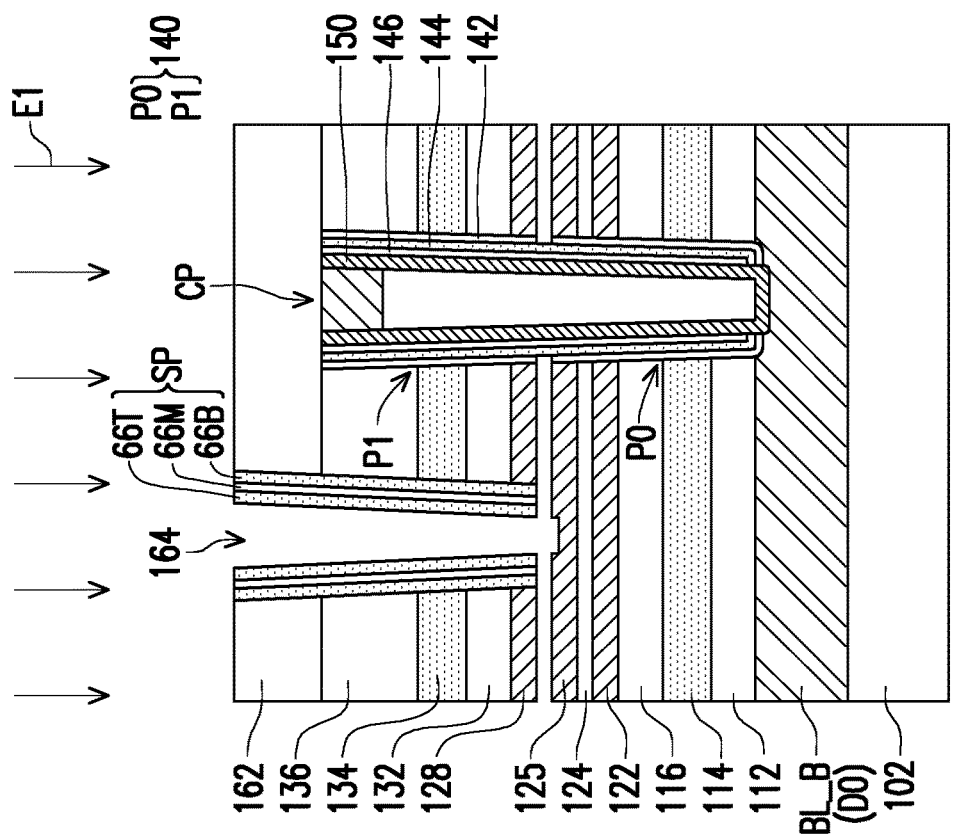
FIG. 4A to FIG. 4D are schematic cross-sectional views of a partial fabrication process of a memory device according to another embodiment of the invention.
Figure 4A:
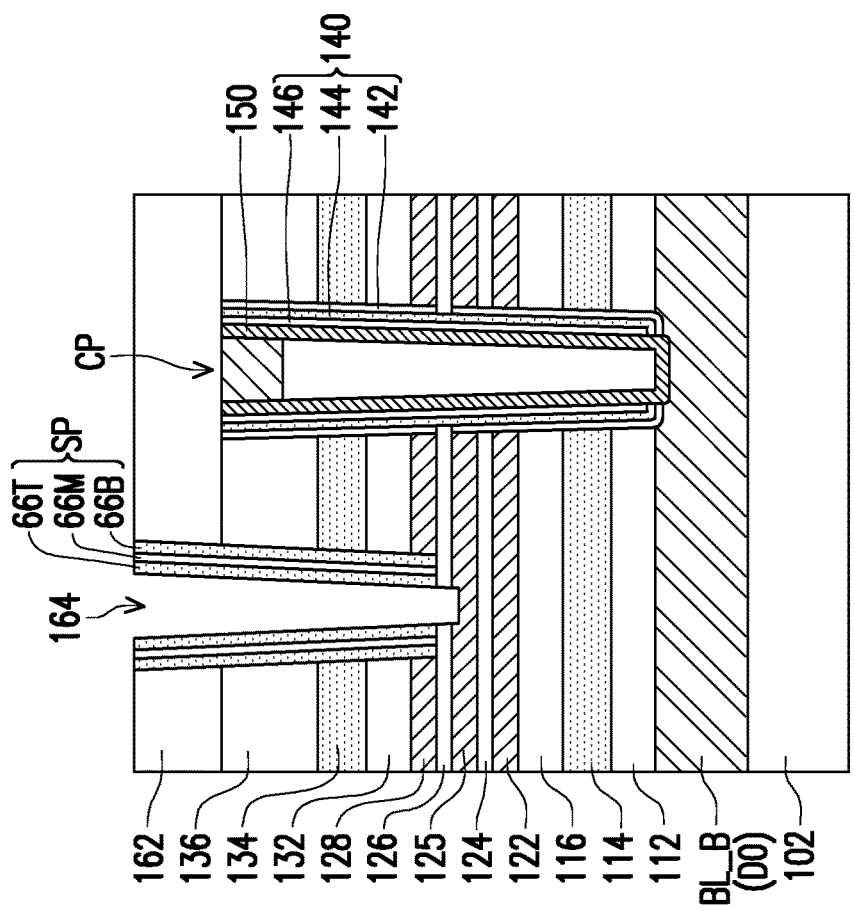

Referring to FIG. 4A and FIG. 4B, a first etching process E1 is performed, where a fluorine-containing etchant (for example, hydrofluoric acid) is used to remove the third sacrificial layer 126 and a part of the blocking layer 142 at the same time to expose the second sacrificial layer 125 and the charge storage layer 144. During the etching process, since the passivation layer SP is a thick silicon nitride layer (FIG. 3I) or a composite layer of silicon nitride 66T/silicon oxide 66M/silicon nitride 66B, it is silicon nitride itself or the material of an outermost layer thereof is silicon nitride 66T, and the second sacrificial layer 125 is a doped polysilicon layer, the materials of the these layers are all different from the material of the third sacrificial layer 126 and the blocking layer 142 made of silicon oxide, so that the passivation layer SP and the second sacrificial layer 125 may be used as protective layers during the etching process. The passivation layer SP may be used to protect the sidewall of the recess slit 164, and the second sacrificial layer 125 may be used to protect the underlying material layers.

Figure 4C:
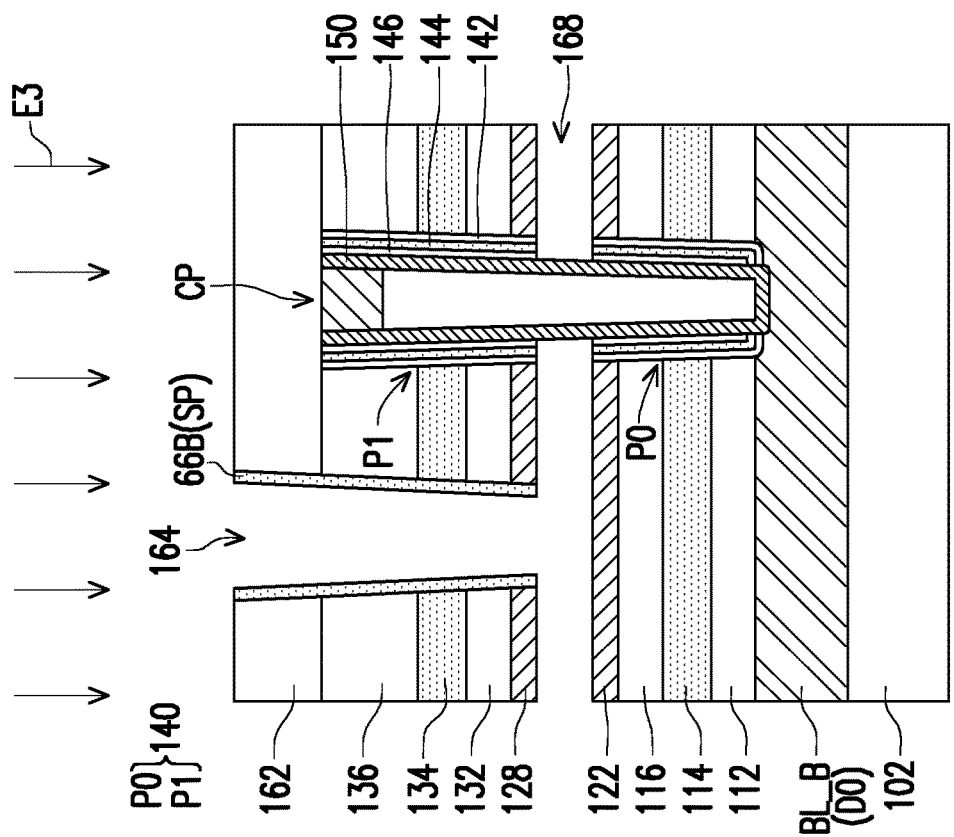

Referring to FIG. 4B and FIG. 4C, a second etching process E2 is performed, for example, phosphoric acid is used to remove the second sacrificial layer 125 and a part of the charge storage layer 144 at the same time to expose the first sacrificial layer 124 and the tunneling layer 146. During the etching process, since the first sacrificial layer 124 is silicon oxide, its material is different from the material of the second sacrificial layer 125 made of doped polysilicon and different from the material of the charge storage layer 144 made of silicon nitride. Therefore, during the etching process, the first sacrificial layer 124 may be left to protect the underlying material layers. Moreover, in the embodiment where the passivation layer SP is a thick silicon nitride layer, after the etching process is performed, although the thickness of the passivation layer SP is reduced, the passivation layer SP still has sufficient thickness to be left on the sidewall of the recess slit 164. In the embodiment where the passivation layer SP is a composite layer of silicon nitride 66T/silicon oxide 66M/silicon nitride 66B, since the passivation layer SP has the silicon oxide 66M, even if the silicon nitride 66T serving as the outermost layer of the composite layer of the passivation layer SP is etched to expose the silicon oxide 66M of the composite layer, since the silicon oxide 66M is different from the material of the second sacrificial layer 125 made of doped polysilicon and different from the material of the charge storage layer 144 made of silicon nitride, it may be used as a protective layer during the etching process to protect the sidewall of the recess slit 164.

Figure 4D:
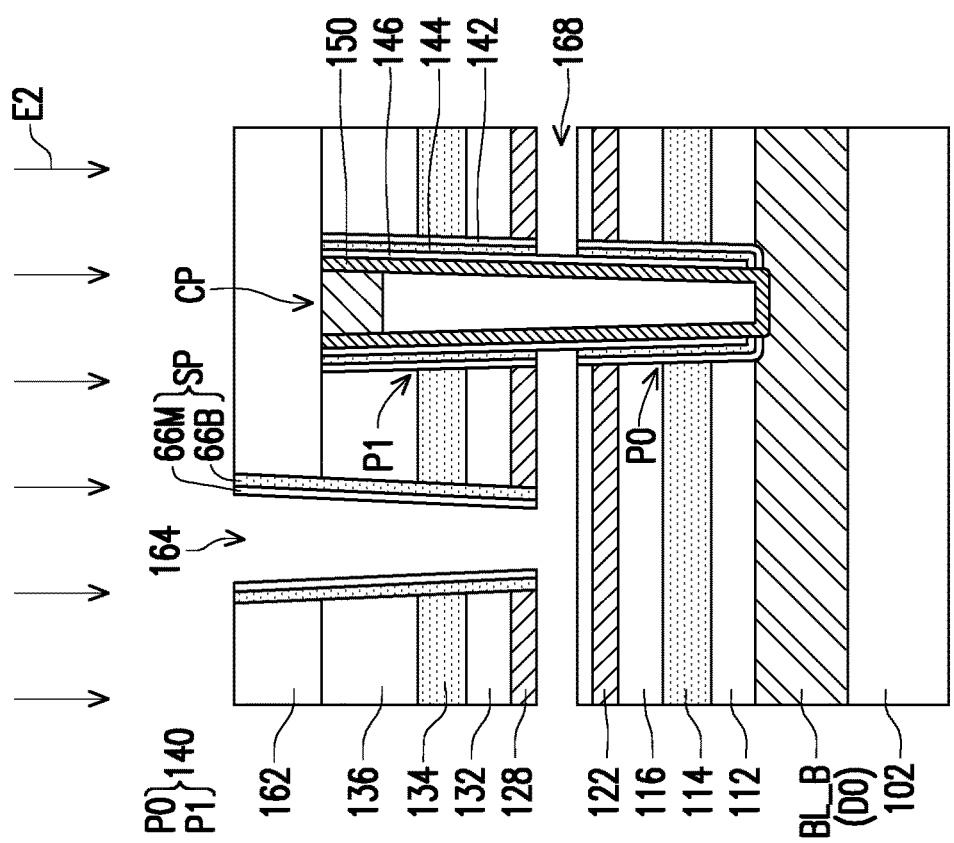

Referring to FIG. 4C and FIG. 4D, thereafter, a third etching process E3 is performed, where a fluorine-containing etchant (for example, hydrofluoric acid) is used to remove the first sacrificial layer 124 and a part of the tunneling layer 146 at the same time. During the etching process, since the passivation layer SP is a thick silicon nitride layer or a composite layer of silicon nitride 66T/silicon oxide 66M/silicon nitride 66B, it is silicon nitride itself or the material of an innermost layer thereof is silicon nitride 66B. The materials of the left passivation layer SP and the first doped polysilicon layer 122 are all different from the material of the first sacrificial layer 124 and the tunneling layer 146 made of silicon oxide, so that the passivation layer SP and the first doped polysilicon layer 122 may be used as protective layers during the etching process. The passivation layer SP may be used to protect the sidewall of the recess slit 164, and the first doped polysilicon layer 122 may be used to protect the underlying material layers. After the aforementioned etching processes E1 to E3, the source line trench 168 exposing the first doped polysilicon layer 122, the second doped polysilicon layer 128 and the channel layer 150 is formed, and the charge storage structure 140 is divided into two portions, i.e., the lower portion P0 and the upper portion P1.

Figure 3L:
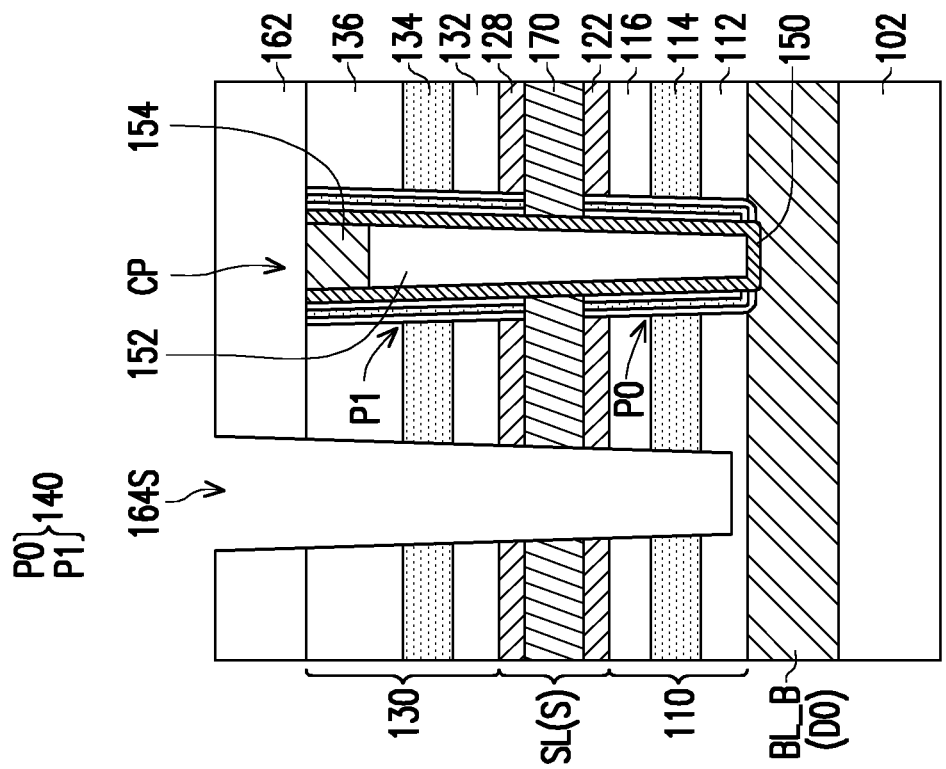
Figure 3K:
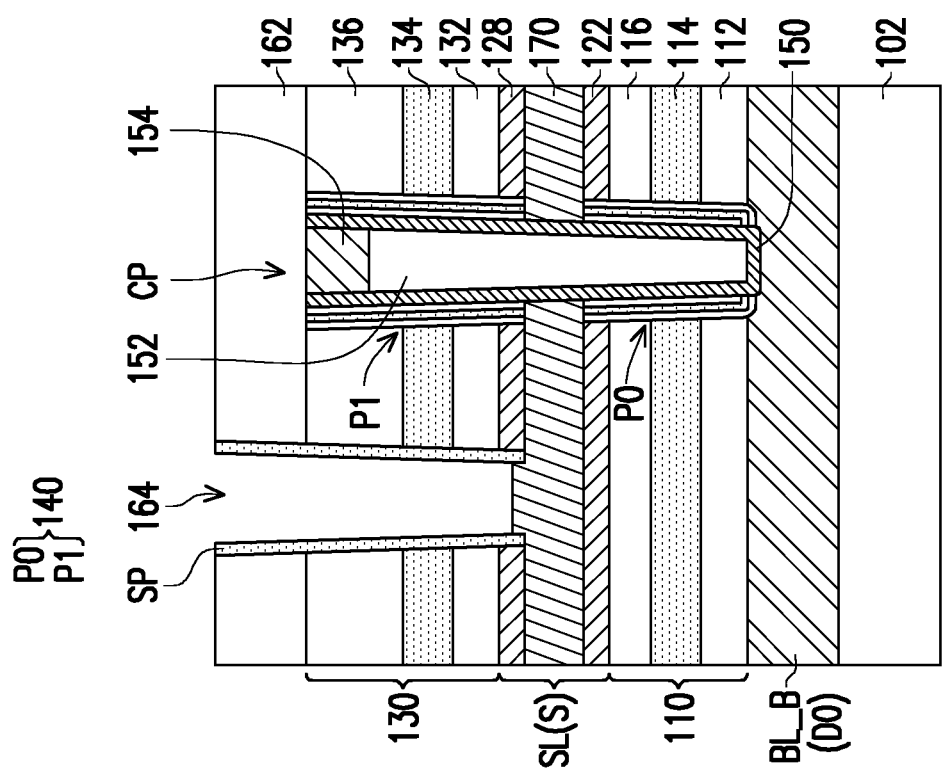

Referring to FIG. 3K, a doped polysilicon layer 170 is formed in the source line trench 168. The doped polysilicon layer 170, the first doped polysilicon layer 122 and the second doped polysilicon layer 128 commonly form a source line SL (a source S). Since the doped polysilicon layer 170 and the first doped polysilicon layer 122 or the second doped polysilicon layer 128 are formed at different times, interfaces may respectively exist between the doped polysilicon layer 170 and the first doped polysilicon layer 122 and between the doped polysilicon layer 170 and the second doped polysilicon layer 128. A method of forming the doped polysilicon layer 170, for example, includes following steps. A doped polysilicon material layer is formed by a chemical vapor deposition process. The doped polysilicon material layer covers the top surface of the stop layer 162 and fills the recess slit 164 and the source line trench 168. Thereafter, an etch-back process may be performed to remove the doped polysilicon material layer covering the surface of the stop layer 162 and filled in the recess slit 164.

Referring to FIG. 3L, the source line SL (the source S) and a part of the first stacked structure 110 under the recess slit 164 are removed to form a recess slit 164S. The recess slit 164S at least extends beyond the sacrificial layer 114 in depth to expose the first insulating layer 112 at the bottom.

Figure 3M:
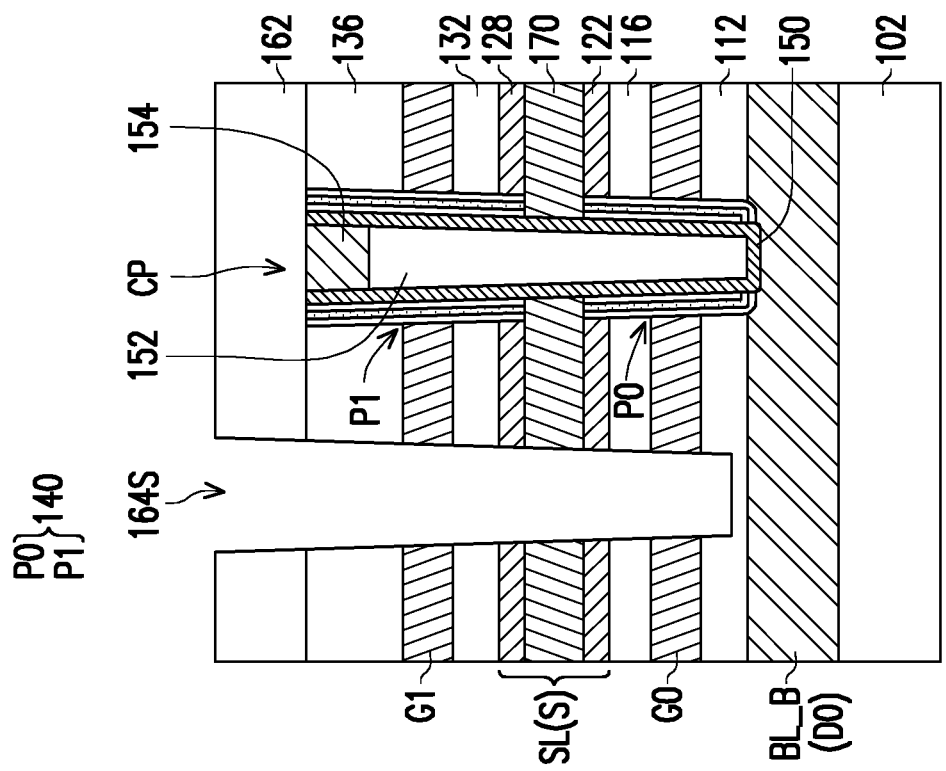

Referring to FIG. 3M, an etching process is performed to remove the sacrificial layers 114 and 134 to form gate trenches 172 and 174. The etching method may be dry etching, wet etching, or a combination thereof. In the embodiment where the sacrificial layers 114 and 134 are silicon nitride, phosphoric acid may be used as an etchant. During this stage of the fabrication process, the dummy pillars in the stepped region of the substrate may provide structural support in the process to avoid collapse of layers or the structure.

Figure 3N:
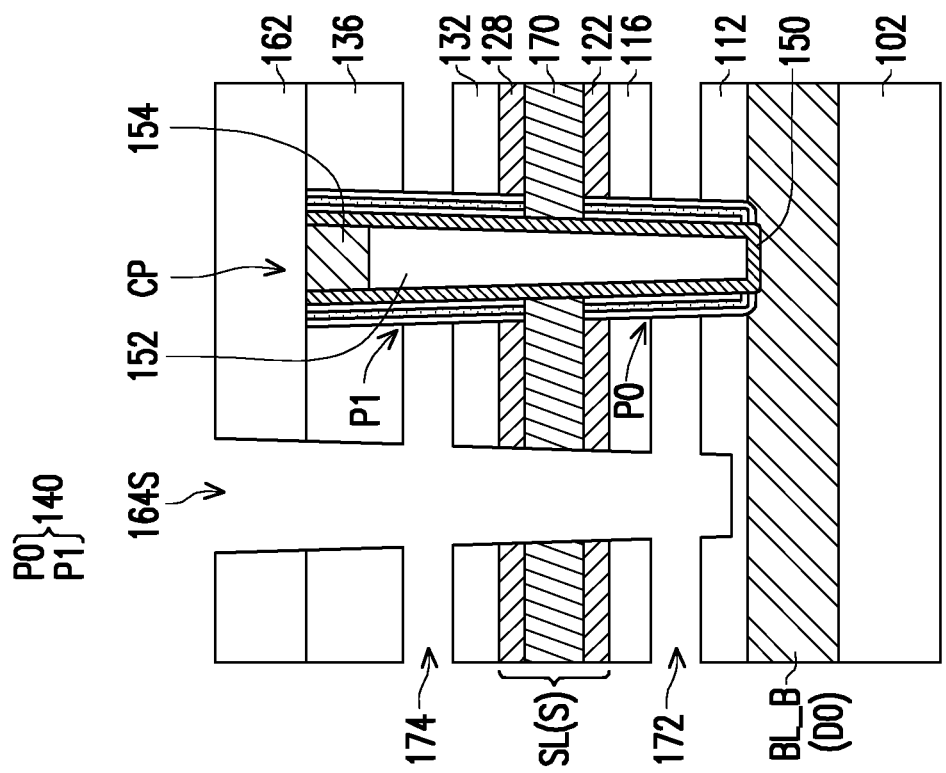
Figure 30:
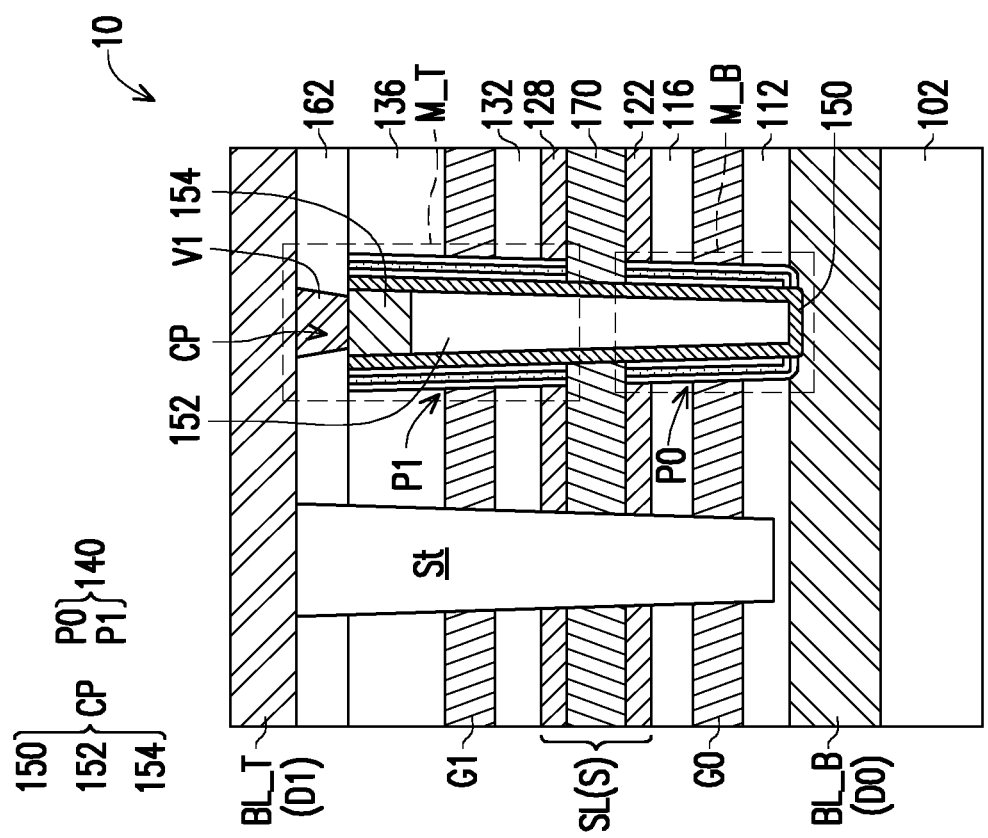

Referring to FIG. 3N, a gate G0 and a gate G1 are formed in the gate trenches 172 and 174. The method of forming the gate G0 and the gate G1 is, for example, to form a conductive material such as doped polysilicon, amorphous silicon, tungsten (W), cobalt (Co), aluminum (Al), tungsten silicide ($WSi_x$), or cobalt silicide ($CoSi_x$) through a chemical vapor deposition process or a physical vapor deposition process. During the process of forming the conductive material, the conductive material covers the top surface of the stop layer 162 and fills the recess slit 164S and the gate trenches 172 and 174. Thereafter, an etch-back process may be performed to remove the conductive material covering the top surface of the stop layer 162 and filled in the recess slit 164S.

Referring to FIG. 3O, an insulating silt St is formed in the recess slit 164S. A method for forming the insulating slit St is, for example, to form an insulating material layer such as silicon oxide or spin-on glass, etc., on the stop layer 162 by using a chemical vapor deposition method or a spin coating method. Thereafter, the stop layer 162 is used as a polishing stop layer or an etching stop layer to perform an etch-back process or a chemical mechanical polishing process to remove the insulating material layer on the stop layer 162.

Then, the via V1 is formed in the stop layer 162. A method for forming the via V1 is, for example, to form a via hole in the stop layer 162 through a lithography and etching process. Then, a conductive material such as doped polysilicon, amorphous silicon, tungsten (W), cobalt (Co), aluminum (Al), tungsten silicide ($WSi_x$), or cobalt silicide ($CoSi_x$) is formed on the stop layer 162 through a chemical vapor deposition process or a physical vapor deposition process. Thereafter, an etch-back process or a chemical mechanical polishing process is performed to remove the conductive material covering the surface of the stop layer 162.

Thereafter, a plurality of the bit lines BL_T (the drain D0 are formed on the stop layer 162. A method of forming the bit lines BL_T is, for example, to form doped polysilicon by using a chemical vapor deposition process, and then perform patterning by using a lithography and etching process. The bit lines BL_T are electrically connected to the channel pillars CP through the vias V1.

The gate G0, the lower portion P0 of the charge storage structure 140, the channel pillar CP, the drain D0 and the source S form a first memory cell M_B. The gate G1, the upper portion P1 of the charge storage structure 140, the channel pillar CP, the drain D1 and the source S form a second memory cell M_T. The second memory cell M_T is stacked on the first memory cell M_B.

Figure 5B:
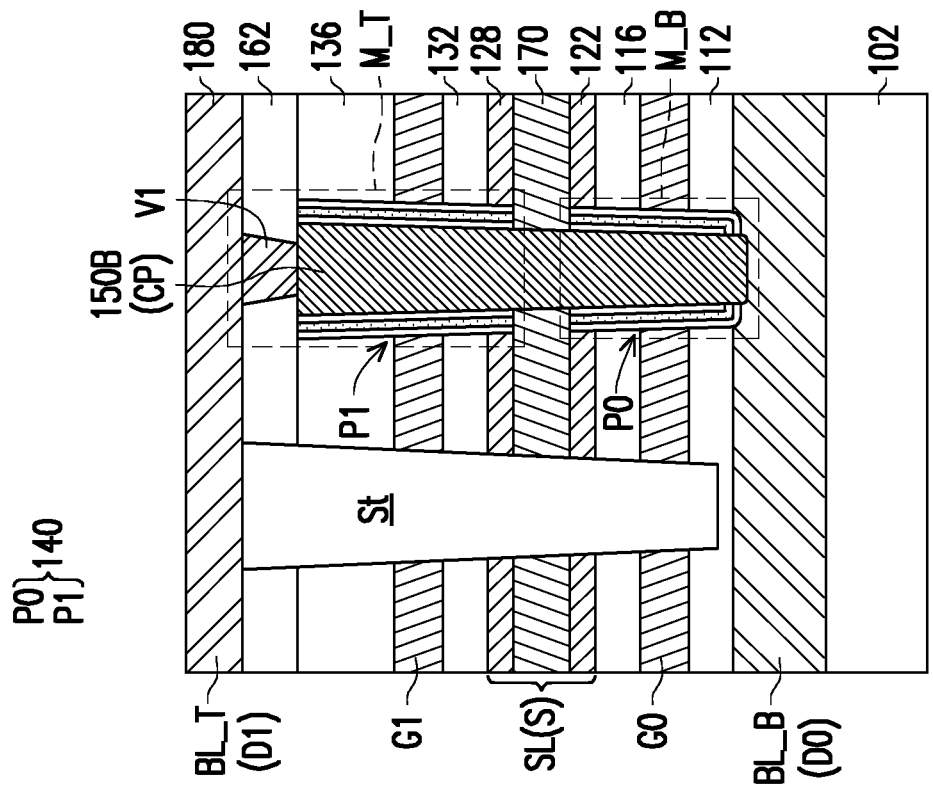
FIG. 5A to FIG. 5B are schematic cross-sectional views of a partial fabrication process of a memory device according to still another embodiment of the invention.
Figure 5A:
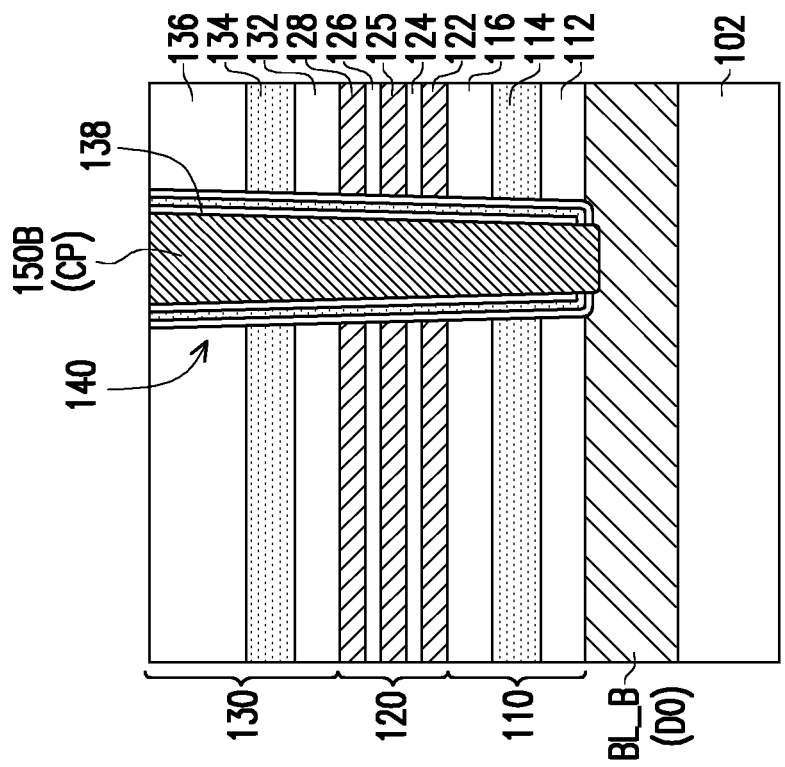

In the aforementioned embodiment, the channel pillar CP includes the insulating core 152, the conductive plug 154 and the channel layer 150. However, the embodiment of the invention is not limited thereto. In other embodiments, the channel pillar CP may also be composed of a solid doped semiconductor pillar 150B, as shown in FIGS. 5A and 5B. Referring to FIG. 3D and FIG. 5A, a method of forming the doped semiconductor pillar 150B is, for example, to form a doped semiconductor layer on the third stacked structure 130, and the doped semiconductor layer further fills the hole 138. The doped semiconductor layer is, for example, doped epitaxial silicon. Thereafter, an etch-back process or a chemical mechanical polishing process is performed to remove the conductive material covering the surface of the stop layer 162. A memory device using the solid doped semiconductor pillar 150B as the channel pillar CP is shown in FIG. 5B. Referring to FIG. 5B, the channel pillar CP is the solid doped semiconductor pillar 150B, which is in direct contact with and electrically connected to the bit line BL_B (the drain D0), and is in direct contact with the via V1 and is electrically connected to the bit line BL_T directly through the via V1 without using a conductive plug. A structure of the dummy pillar DP in the stepped region may be the same as a combined structure of the charge storage structure 140 and the channel pillar CP, but a size thereof may be the same as or similar to that of the memory hole (or the channel hole).

Moreover, referring to FIG. 1A, in some embodiments, upper and lower sides of each channel pillar CP may be crossed by a single bit line BL_B and a single bit line BL_T. For example, the channel pillar CP of the memory cell group MCt0 is crossed by a single bit line BL0_B and a single bit line BL0_T. In some other embodiments, the upper and lower sides of each channel pillar CP may be crossed by two bit lines BL_T and two bit lines BL_B (not shown) under the two bit lines BL_T, as shown in FIG. 6.

Figure 6:
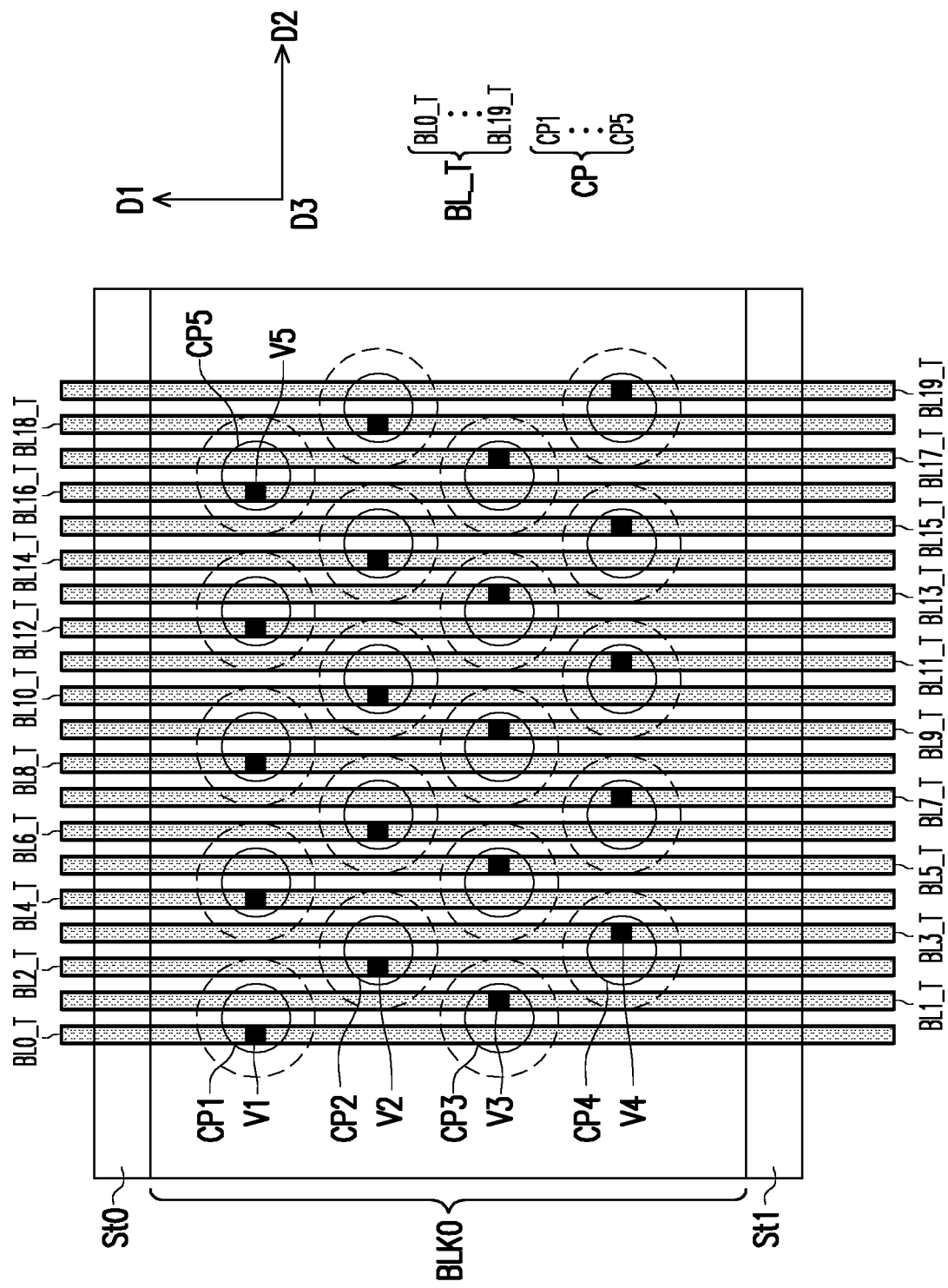
FIG. 6 is a top view of a memory device according to another embodiment of the invention.

Referring to FIG. 6, the memory device includes the bit line BL_B (not shown) and the bit line BL_T. The bit line BL_B includes bit lines BL0_B, BL1_B, . . . BL19_B (not shown). The bit line BL_T includes bit lines BL0_T, BL1_T, . . . BL19_T. The bit lines BL0_T and BL1_T cross the channel pillars CP1 and CP3 of a same column. The bit line BL0_T is electrically connected to the channel pillar CP1, and is not electrically connected to the channel pillar CP3. The bit line BL1_T is not electrically connected to the channel pillar CP1, but is electrically connected to the channel pillar CP3. The bit lines BL2_T and BL3_T cross the channel pillars CP2 and CP4 of a same column. The bit line BL2_T is electrically connected to the channel pillar CP2, but is not electrically connected to the channel pillar CP4. The bit line BL3_T is not electrically connected to the channel pillar CP2, but is electrically connected to the channel pillar CP4. In other words, the vias (for example, V1 and V3) above the channel pillars CP (for example, CP1 and CP3) of the same column are misaligned in the first direction d1 without being aligned. The vias (for example, V1 and V5) above the channel pillars CP (for example, CP1 and CP5) of the same row may be aligned or misaligned in the second direction d2.

In some other embodiments, the memory device may also be made into a 3D memory device in a way of stacking.

Figure 7A:
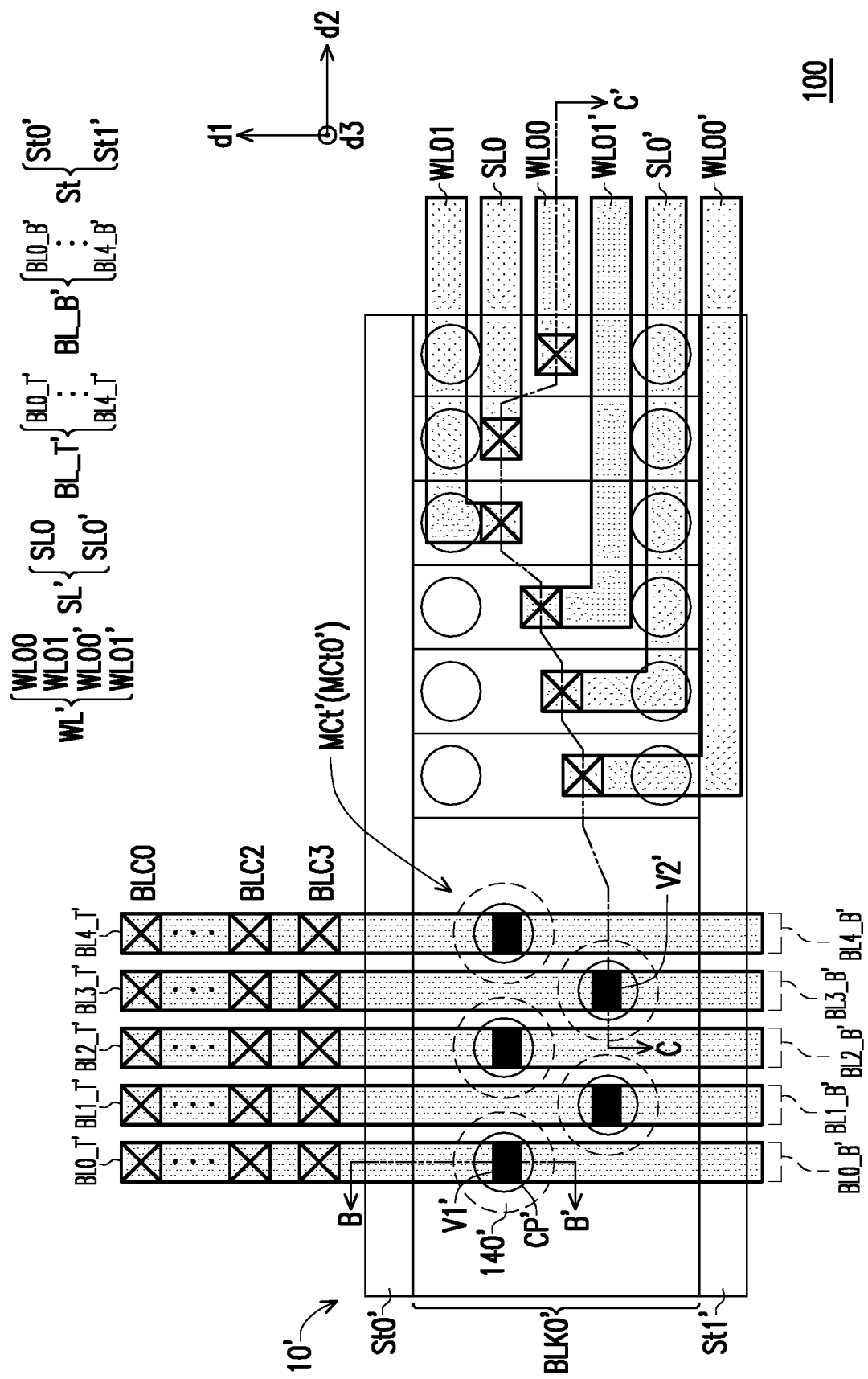
FIG. 7A is a top view of a 3D memory device according to an embodiment of the invention.
Figure 7B:
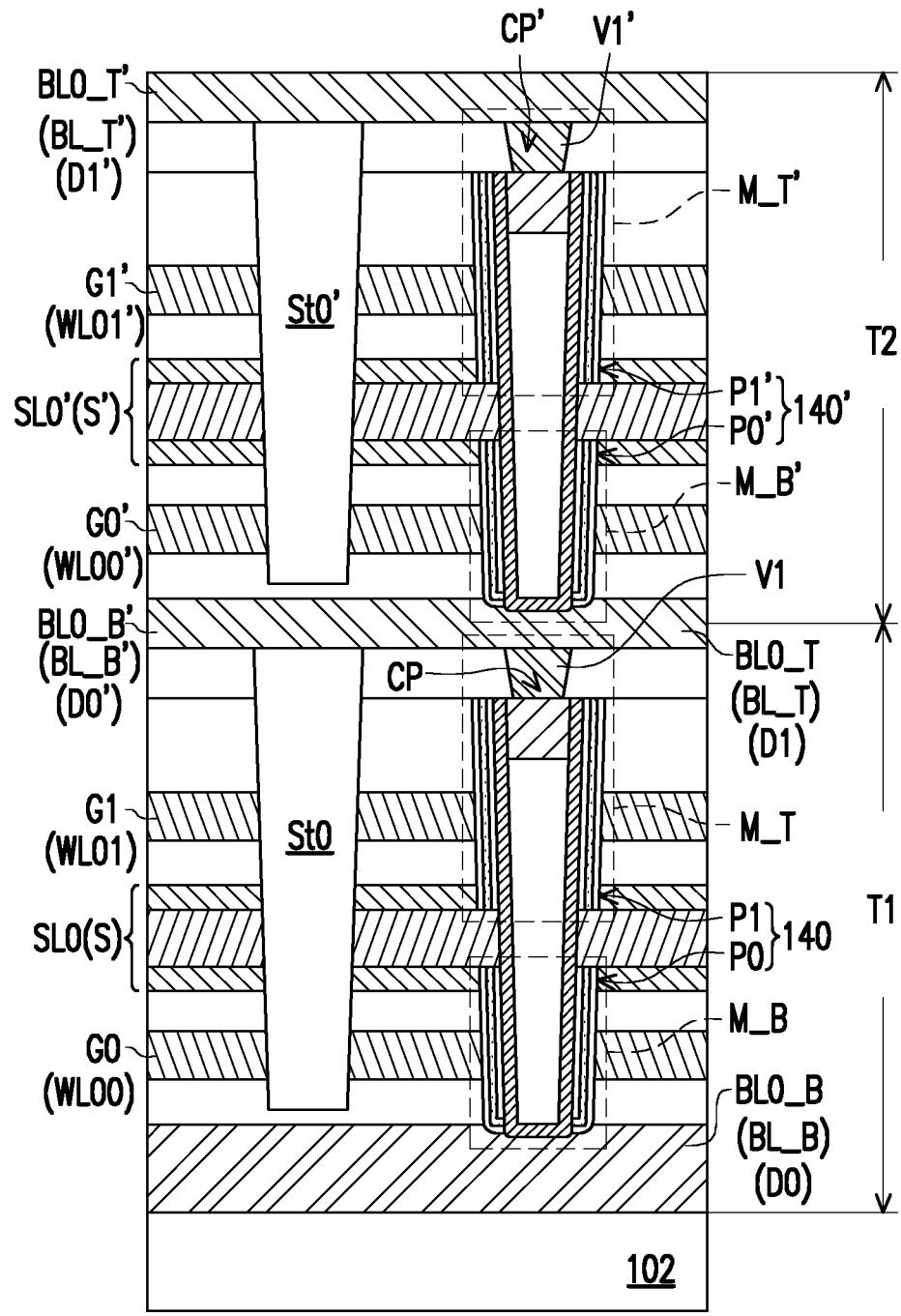
FIG. 7B is a cross-sectional view of FIG. 7A along a line B-B'.
Figure 7C:
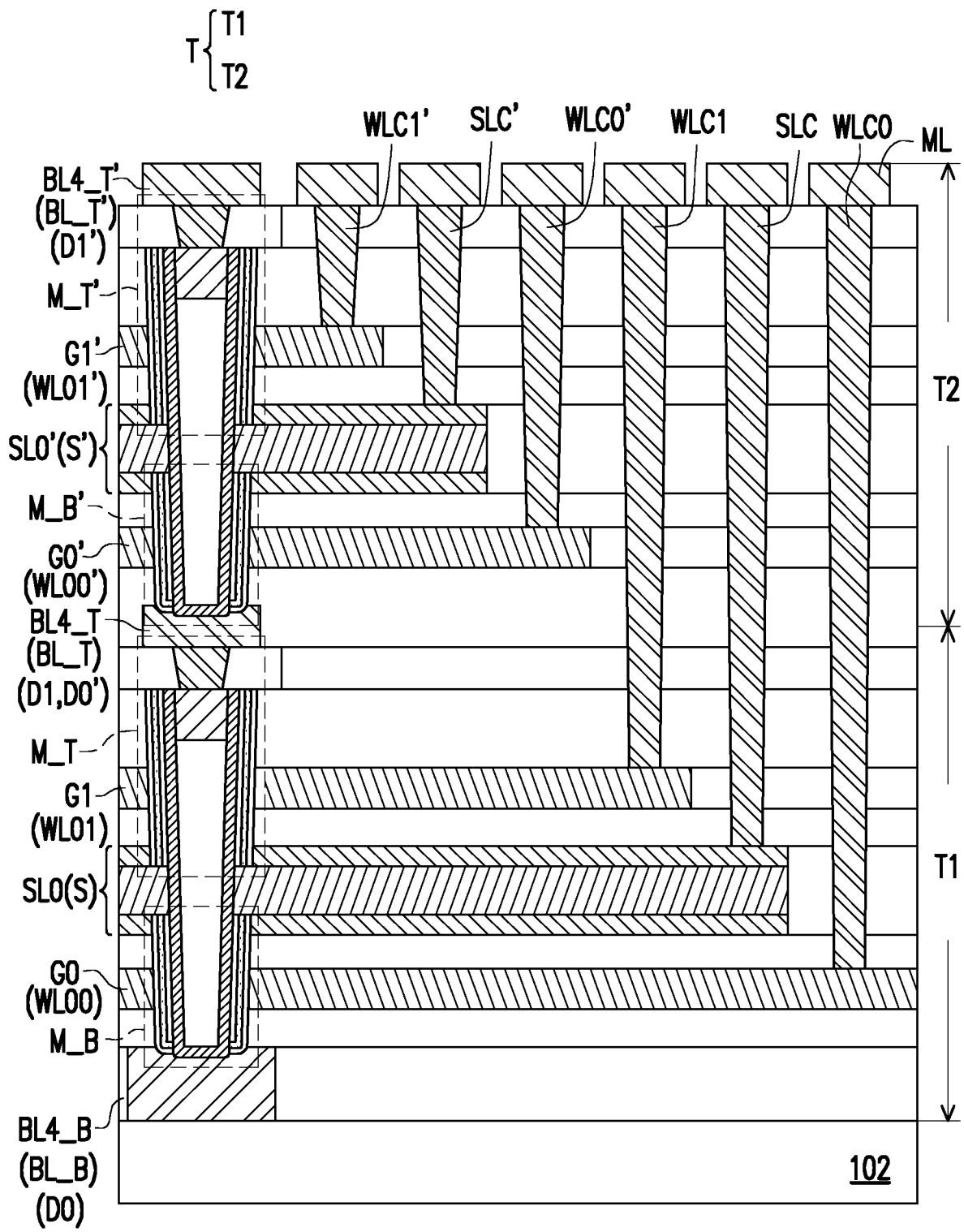
FIG. 7C is a cross-sectional view of FIG. 7A along a line C-C'.

Referring to FIGS. 7A, 7B and 7C, a 3D memory device 10' includes a plurality of tiers of semiconductor layers T. In FIGS. 7B and 7C, two tiers of semiconductor layers T1 and T2 are used for description. However, the invention is not limited thereto, and the 3D memory device 10' may include more tiers of semiconductor layers. For example, the 3D memory device 10' may include 2 to 12 tiers of semiconductor layers T. The semiconductor layer and the aforementioned memory device 10 have similar structures. However, for simplicity's sake, only two insulating silts St' (for example, St0 and St1) and a single block BLK' (for example, BLK0') are illustrated in FIGS. 7A, 7B and 7C.

Referring to FIG. 7A and FIG. 7B, the semiconductor layer T2 and the semiconductor layer T1 have similar structures. In the semiconductor layer T2, a structure and arrangement of a plurality of memory cell groups MCt' (for example, MCt0') in each of a plurality of blocks BLK' (for example, BLK0') separated by a plurality of insulating silts St' (for example, St0' and SU') may be the same as or similar to the structure and arrangement of a plurality of the memory cell groups MCt in each block BLK. The semiconductor layer T2 includes a plurality of memory cell groups MCt'. Each of the memory cell groups MCt' includes a third memory cell M_B' and a fourth memory cell M_T' stacked in a third direction d3.

Referring to FIG. 7A, the semiconductor layer T2 further includes a plurality of bit lines BL_B' and a plurality of bit lines BL_T' extending in the first direction d1. The bit lines BL_B', for example, include bit lines BL0_B', BL1_B', BL2_B', BL3_B', and BL4_B', or more bit lines. The bit lines BL_T', for example, include bit lines BL0_T', BL1_T', BL2_T', BL3_T', and BL4_T', or more bit lines. Each bit line BL_B' of the semiconductor layer T2 is located on the bit line BL_T of the semiconductor layer T1, and each bit line BL_T' of the semiconductor layer T2 is located on the bit line BL_B'. Ends of the bit lines BL_B and BL_T of the semiconductor layer T1 and the bit lines BL_B' and BL_T' of the semiconductor layer T2 may present a stepped shape. The bit lines BL_B are connected to the metal layer ML through bit line contacts BLC0. In the embodiment, the bit lines BL_T and BL_B' may be shared and connected with the metal layer ML through bit line contacts BLC2. The bit lines BL_T' are connected to the metal layer ML through bit line contacts BLC3.

Referring to FIG. 7A and FIG. 7C, the semiconductor layer T2 further includes a word line WL00', a word line WL01', and a source line SL0' extending in the second direction d2. In the second region R2, an end of the word line WL00 of the semiconductor layer T1 is connected to the metal layer ML through the word line contact WLC0. An end of the word line WL01 is connected to the metal layer ML through the word line contact WLC1. An end of the source line SL0 is connected to the metal layer ML through the source line contact SLC. An end of the word line WL00' of the semiconductor layer T2 is connected to the metal layer ML through a word line contact WLC0'. An end of the word line WL01' is connected to the metal layer ML through a word line contact WLC1'. An end of the source line SL0' is connected to the metal layer ML through a source line contact SLC'.

The end of the word line WL00, the end of the source line SL0, the end of the word line WL01, the end of the word line WL00', the end of the source line SL0', and the end of the word line WL01' are disposed in the second region R2 of the block BLK0, and may present a stepped shape. Moreover, a plurality of dummy pillars DP' may also be included in the second region R2 to provide structural support during the fabrication process and avoid collapse of layers or structures. A structure of the dummy pillar DP' may be similar to that of the dummy pillar DP.

Figure 8:
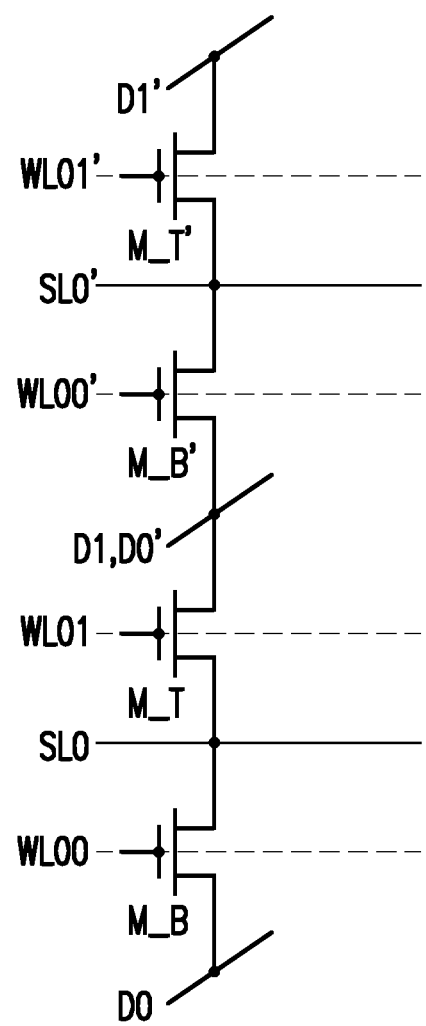
FIG. 8 is an equivalent circuit diagram of FIG. 7C.

FIG. 8 is an equivalent circuit diagram of FIG. 7C. Referring to FIG. 7C and FIG. 8, the memory cell M_B includes a gate G0, a source S, a drain D0, a lower portion P0 of the charge storage structure 140, and a channel pillar CP. The memory cell M_T includes a gate G1, the source S, a drain D1, an upper portion P1 of the charge storage structure 140 and the channel pillar CP. The memory cell M_B' includes a gate G0', a source S', a drain D0', a lower portion P0' of the charge storage structure 140', and a channel pillar CP'. The memory cell M_T' includes a gate G1', the source S', a drain D1', an upper portion P1' of the charge storage structure 140' and the channel pillar CP'. The memory cell M_B' and the memory cell M_T' share the source S'. The drain D0' of the memory cell M_B' and the drain D1 of the memory cell M_T are shared.

In a method of fabricating the 3D memory device 10', the semiconductor device 10 may be formed according to the aforementioned method to complete the first semiconductor layer T1. Then, a cycle process is performed to form the second semiconductor layer T2. The cycle process includes repeating the steps of forming the first stacked structure 110, the second stacked structure 120, and the third stacked structure 130 in FIG. 3A to the step of forming a plurality of the bit lines BL_T of FIG. 3O, and/or according to FIG. 4A to FIG. 4D or FIG. 5A and FIG. 5B.

In summary, the NOR flash memory device of the invention includes two memory cells stacked vertically in a unit area, so as to effectively utilize the area of the substrate. The 3D NOR flash memory device may include a plurality of memory cells stacked vertically in the unit area, so as to effectively utilize the area of the substrate. In addition, the fabrication processes of the NOR flash memory device and the 3D NOR flash memory device of the invention may be compatible with the existing fabrication process.

What is claimed is:

1. A memory device, comprising:
   at least one semiconductor layer, located on a dielectric layer, the at least one semiconductor layer comprising:
      a first bit line and a second bit line, wherein the first bit line is located on the dielectric layer, and the second bit line is located over the first bit line;
      a first word line and a second word line, located between the first bit line and the second bit line;
      a source line, located between the first word line and the second word line;
      a channel pillar, penetrating through the first word line, the source line, and the second word line, and being connected to the first bit line, the source line, and the second bit line; and
      a charge storage structure, comprising:
         an upper portion, surrounding an upper sidewall of the channel pillar and located between the second word line and the channel pillar; and
         a lower portion, surrounding a lower sidewall of the channel pillar and located between the first word line and the channel pillar,
      wherein the first word line, the lower portion of the charge storage structure, the channel pillar, the first bit line, and the source line form a first memory cell, the second word line, the upper portion of the charge storage structure, the channel pillar, the second bit line, and the source line form a second memory cell, and the second memory cell is located above the first memory cell,
   wherein the channel pillar is crossed by two of the first bit line and two of the second bit line, and the channel pillar is electrically connected to one of the two of the first bit line and one of the two of the second bit line, and is not electrically connected to the other one of the two of the first bit line and the other one of the two of the second bit line.

2. The memory device of claim 1, further comprising a plurality of insulating silts, wherein the first bit line and the second bit line extend in a first direction, and cross the insulating silts extending in a second direction.

3. The memory device of claim 1, wherein the channel pillar comprises an insulating core, a conductive plug and a channel layer surrounding sidewalls of the insulating core and the conductive plug and a bottom of the insulating core.

4. The memory device of claim 3, wherein the source line contacts a portion of the channel layer.

5. The memory device of claim 4, wherein the source line contacts the portion of the channel layer between the upper portion and the lower portion of the charge storage structure.

6. The memory device of claim 1, wherein the at least one semiconductor layer comprises 1 to 12 tiers.

7. The memory device of claim 1, wherein the at least one semiconductor layer comprises a first semiconductor layer and a second semiconductor layer over the first semiconductor layer, and a first bit line of the second semiconductor layer and a second bit line of the first semiconductor layer are shared.

8. The memory device of claim 1, further comprising a plurality of dummy pillars penetrating through the first word line, the source line and the second word line, and being not connected to the first bit line, and the second bit line.

9. A method of fabricating a memory device, comprising:
   forming a first bit line on a dielectric layer; and
   performing at least one cycle process, wherein the at least one cycle process comprises:
      forming a first stacked structure, a second stacked structure and a third stacked structure on the first bit line and the dielectric layer, wherein the first stacked structure and the third stacked structure respectively comprise a first insulating layer, a sacrificial layer and a second insulating layer stacked from bottom to top;
      forming a hole in the third stacked structure, the second stacked structure and the first stacked structure;
      forming a charge storage structure on a sidewall of the hole;
      forming a channel pillar in the hole, wherein the channel pillar covers the charge storage structure and is connected to the first bit line;
      forming a recess slit in the third stacked structure and a part of the second stacked structure;
      forming a passivation layer on a sidewall of the recess slit;
      removing a part of the second stacked structure and a part of the charge storage structure by using the third stacked structure and the passivation layer as a mask to form a source line trench, expose a sidewall of the channel pillar, and separate the charge storage structure into an upper portion and a lower portion;
      forming a source line in the source line trench;

removing a part of the source line and a part of the first stacked structure below the recess slit to deepen the recess slit;

removing the passivation layer, removing the sacrificial layer of the first stacked structure and the sacrificial layer of the third stacked structure exposed by the recess slit to form a first word line trench and a second word line trench respectively;

forming a first word line and a second word line in the first word line trench and the second word line trench;

forming an insulating silt in the recess slit; and forming a second bit line over the third stacked structure, wherein the second bit line is electrically connected to the channel pillar, wherein the first word line, the lower portion of the charge storage structure, the channel pillar, the first bit line, and the source line form a first memory cell, and the second word line, the upper portion of the charge storage structure, the channel pillar, the second bit line, and the source line form a second memory cell.

10. The method of claim 9, wherein the first insulating layer and the second insulating layer comprise silicon oxide, and the sacrificial layer comprises silicon nitride.

11. The method of claim 9, wherein the second stacked structure comprises a first doped polysilicon layer, a first silicon oxide layer, a second doped polysilicon layer, a second silicon oxide layer, and a third doped polysilicon layer stacked from bottom to top.

12. The method of claim 11, wherein the recess slit at least extends to the second polysilicon layer in the forming the recess slit in the third stacked structure and a part of the second stacked structure.

13. The method of claim 11, wherein the removing a part of the second stacked structure comprises:

performing a first etching process to remove the second silicon oxide layer;

performing a second etching process to remove the second polysilicon layer; and performing a third etching process to remove the first silicon oxide layer.

14. The method of claim 11, wherein the passivation layer comprises silicon nitride, silicon nitride/silicon oxide/silicon nitride, silicon oxynitride (SiON), silicon carbide (SiC), silicon carbon nitride (SiCN), silicon carbide oxynitride (SiCON), or a combination thereof.

15. The method of claim 9, further comprising:

forming a stop layer on the third stacked structure before the forming the second bit line over the third stacked structure; and forming a via in the stop layer, wherein the via is connected to the channel pillar.

16. The method of claim 9, further comprising:

forming a dummy pillar in the third stacked structure, the second stacked structure and the first stacked structure during the forming the channel pillar in the hole, wherein the dummy pillar is not connected to the first bit line.

* * * * *